US011198757B2

(12) United States Patent
Clough et al.

(10) Patent No.: US 11,198,757 B2
(45) Date of Patent: Dec. 14, 2021

(54) COMPOSITIONS INCLUDING A PHOTOLATENT AMINE, CAMPHORQUINONE, AND COUMARIN AND RELATED METHODS

(71) Applicant: 3M INNOVATIVE PROPERTIES COMPANY, St. Paul, MN (US)

(72) Inventors: Robert S. Clough, St. Paul, MN (US); Sheng Ye, Redmond, WA (US); Tao Gong, Woodbury, MN (US); Jonathan D. Zook, Stillwater, MN (US); Susan E. DeMoss, Stillwater, MN (US); Charlie P. Blackwell, St. Paul, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 72 days.

(21) Appl. No.: 16/347,426

(22) PCT Filed: Nov. 2, 2017

(86) PCT No.: PCT/US2017/059711
§ 371 (c)(1),
(2) Date: May 3, 2019

(87) PCT Pub. No.: WO2018/085534
PCT Pub. Date: May 11, 2018

(65) Prior Publication Data
US 2019/0256646 A1 Aug. 22, 2019

Related U.S. Application Data

(60) Provisional application No. 62/417,158, filed on Nov. 3, 2016.

(51) Int. Cl.
| | | |
|---|---|---|
| C08G 59/56 | (2006.01) | |
| C08G 75/045 | (2016.01) | |
| C09J 163/00 | (2006.01) | |
| C09J 181/02 | (2006.01) | |
| G03F 7/004 | (2006.01) | |
| G03F 7/038 | (2006.01) | |

(52) U.S. Cl.
CPC .......... *C08G 59/56* (2013.01); *C08G 75/045* (2013.01); *C09J 163/00* (2013.01); *C09J 181/02* (2013.01); *G03F 7/0045* (2013.01); *G03F 7/038* (2013.01)

(58) Field of Classification Search
CPC ...... C08G 59/56; C08G 75/045; C09J 163/00; C09J 181/02; C03F 7/0045; C03F 7/038
USPC ............... 522/57, 63, 65, 168, 170
See application file for complete search history.

(56) References Cited

U.S. PATENT DOCUMENTS

| | | | |
|---|---|---|---|
| 2,466,963 | A | 4/1949 | Patrick |
| 2,789,958 | A | 4/1957 | Fettes |
| 2,800,457 | A | 7/1957 | Green |
| 2,800,458 | A | 7/1957 | Green |
| 3,225,017 | A | 12/1965 | Seegman |
| 3,991,039 | A | 11/1976 | Gunter |
| 4,165,425 | A | 8/1979 | Bertozzi |
| 4,366,307 | A | 12/1982 | Singh |
| 4,609,762 | A | 9/1986 | Morris |
| 4,894,314 | A | 1/1990 | Barr |
| 4,943,516 | A | 7/1990 | Kamayachi |
| 4,948,694 | A | 8/1990 | Ohkuma |
| 5,225,472 | A | 7/1993 | Cameron |
| 5,271,881 | A | 12/1993 | Redding, Jr. |
| 5,409,985 | A | 4/1995 | Robinson |
| 5,430,112 | A | 7/1995 | Sakata |
| 5,610,243 | A | 3/1997 | Vietti |
| 5,912,319 | A | 6/1999 | Zook |
| 5,959,071 | A | 9/1999 | DeMoss |
| 6,057,380 | A * | 5/2000 | Birbaum ................ G03F 7/038 522/8 |
| 6,087,070 | A | 7/2000 | Turner |
| 6,124,371 | A | 9/2000 | Stanssens |
| 6,172,179 | B1 | 1/2001 | Zook |
| 6,410,628 | B1 | 6/2002 | Hall-Goulle |
| 6,509,418 | B1 | 1/2003 | Zook |
| 7,538,104 | B2 | 5/2009 | Baudin |
| 7,923,113 | B2 | 4/2011 | Dogan |
| 7,927,538 | B2 | 4/2011 | Moszner |

(Continued)

FOREIGN PATENT DOCUMENTS

| | | |
|---|---|---|
| JP | S59-129221 | 7/1984 |
| JP | 2009-126974 | 6/2009 |

(Continued)

OTHER PUBLICATIONS

Merkel et al Thermodynamic energies of donor and acceptor triplet states. Journal of Photochemistry and Photobiology A: Chemistry. vol. 193, Issues 2-3, pp. 110-121 (2008) (Year: 2008).*
Blickenstorfer, "Adhesive curing on demand" Paint & Coatings Industry Publication, Nov. 2009, [retrieved from the internet on Dec. 13, 2017], URL <https://www.pcimag.com/articles/89792-adhesive-curing-on-demand?>, pp. 8.
Ciba. "Photoinitiatros for UV Curing: Key products selection Guide 2003". Ciba Specialty Chemicals. Available online at https:// people. rit.edu/deeemc/reference_13/Imprint/Photoinitiators%20for%20UV% 20curing.pdf. Evidentiary reference. (Year: 2003), 8 pages.

(Continued)

*Primary Examiner* — Sanza L. McClendon
(74) *Attorney, Agent, or Firm* — Kathleen B. Gross

(57) ABSTRACT

A composition includes a photolatent amine, camphorquinone, and a coumarin sensitizer. The coumarin sensitizer is triplet photosensitizer and has an absorbance with a wavelength of maximum absorbance in a range from 390 nanometers to 510 nanometers. Compositions that further include a polymerizable material are also disclosed. Polymer networks preparable from such compositions and methods for making the polymer networks are also disclosed.

20 Claims, No Drawings

(56) References Cited

U.S. PATENT DOCUMENTS

| | | |
|---|---|---|
| 8,003,169 B2 | 8/2011 | Misev |
| 9,297,940 B2 | 3/2016 | Shin |
| 9,616,460 B2 | 4/2017 | Templeman |
| 9,637,666 B2 | 5/2017 | Kitano |
| 9,714,317 B2 | 7/2017 | Li |
| 10,072,135 B2 | 9/2018 | Ye |
| 10,526,440 B2 | 1/2020 | Zook |
| 10,703,906 B2 | 7/2020 | Ye |
| 2004/0158023 A1 | 8/2004 | Hwang |
| 2004/0247792 A1 | 12/2004 | Sawant |
| 2006/0175005 A1 | 8/2006 | Sawant |
| 2006/0293403 A1 | 12/2006 | Hubert |
| 2007/0173602 A1 | 7/2007 | Brinkman |
| 2007/0202341 A1 | 8/2007 | Dogan |
| 2007/0249484 A1 | 10/2007 | Benkhoff |
| 2011/0190412 A1 | 8/2011 | Studer |
| 2012/0040103 A1 | 2/2012 | Kelediian |
| 2013/0345389 A1 | 12/2013 | Cai |
| 2014/0110881 A1 | 4/2014 | Keledjian |
| 2015/0065600 A1 | 3/2015 | Ye |
| 2015/0252233 A1 | 9/2015 | Anderson |
| 2016/0032058 A1 | 2/2016 | Ye |
| 2016/0032059 A1 | 2/2016 | Ye |
| 2016/0090507 A1 | 3/2016 | Keledjian |
| 2016/0160080 A1 | 6/2016 | Cai |
| 2016/0355645 A1 | 12/2016 | Martin |
| 2017/0174823 A1 | 6/2017 | Weippert |
| 2018/0030322 A1 | 2/2018 | Bons |

FOREIGN PATENT DOCUMENTS

| | | |
|---|---|---|
| JP | 2010-095686 | 4/2010 |
| JP | 2013-087149 | 5/2013 |
| JP | 2014-133875 | 7/2014 |
| JP | 2014-141419 | 8/2014 |
| WO | WO 2008/088770 | 7/2008 |
| WO | WO 2013/153047 | 10/2013 |
| WO | WO 2014/164244 | 10/2014 |
| WO | WO 2014/172305 | 10/2014 |
| WO | WO 2014/176490 | 10/2014 |
| WO | WO 2016/128547 | 8/2016 |
| WO | WO 2016/176548 | 11/2016 |
| WO | WO 2018/085546 | 5/2018 |
| WO | WO 2018/085550 | 5/2018 |
| WO | WO 2018/227149 | 12/2018 |

OTHER PUBLICATIONS

*CRC Handbook*, 91$^{st}$ Edition, "Dissociation Constants of Organic Acids and Bases", Available online at https://sites.chem.colostate.edu/diverdi/all_courses/CRC%20reference%20data/dissociation%20constants%20of%20organic%20acids%20and%20bases.pdf. Evidentiary reference. (Year: 2010). pp. 8-42-8-51.

Kiniro, "Aminimides Derived From p-Substituted Benzoylformic Acid Ester as Thermal/Photolatent Bases and Photoradical Initiators", *Journal of Polymer Science, Part A: Polymer Chemistry*, Jul. 2013, vol. 51, pp. 4292-4300.

PubChem Compound Summary for CID 7064, National Center for Biotechnology Information, PubChem Compound Database; CID=7064, https://pubchemncbi.nlm.nih.gov/compound/Benzoguanamine#section—Bioconcentration (accessed Jan. 3, 2019) Evidentiary reference. : (Year: 2019).

Salmi, "Quaternary Ammonium Salts of Phenylglyoxylic Acid as Photobase Generators for Thiol-Promoted Epoxide Photopolymerization", *Polymer Chemistry*, Jul. 2014, vol. 5, pp. 6577-6583.

Sangermano, "Photolatent Amines Producing a Strong Base as Photocatalyst For the in-situ Preparation of Organic-Inorganic Hybrid Coatings", *Polymer*, Apr. 2014, vol. 55, No. 7, pp. 1628-1635.

Suyama, "Photobase Generators: Recent Progress and Application Trend in Polymer Systems", *Progress in Polymer Science*, 2009, vol. 34, pp. 194-209.

Specht,"Ketocoumarins: A new class of triplet sensitizers", *Tetrahedron*, vol. 38, No. 9, pp. 1203-1211 (1982).

"Adhesive curing on demand" in www.pcimag.com Nov. 2009 by BASF, pp. 28-32.

Teshima, "ESR study of camphorquinone/amine photoinitiator systems using blue light-emitting diodes", *Biomaterials*, vol. 24, pp. 2097-2103 (2003).

International Search Report for PCT International Application No. PCT/US2017/059711, dated Apr. 26, 2018, 5 pages.

* cited by examiner

COMPOSITIONS INCLUDING A PHOTOLATENT AMINE, CAMPHORQUINONE, AND COUMARIN AND RELATED METHODS

CROSS-REFERENCE TO RELATED APPLICATION

This application is a national stage filing under 35 U.S.C. 371 of PCT/US2017/059711, filed Nov. 2, 2017, which claims priority to U.S. Provisional Application No. 62/417,158, filed Nov. 3, 2016, the disclosure of which is incorporated by reference in its entirety herein.

BACKGROUND

Radiation curing of resins is a useful technology for forming or patterning, for example, coatings, adhesives, and photoresists. Resins that are polymerized or cured by free radical or cationic mechanisms upon irradiation with ultraviolet (UV) light are commonly used. Vinyl-based resins (e.g., (meth)acrylates, (meth)acryamides, N-vinyl amides, and styrenes) are typical resins that can be radiation-cured by free-radical mechanisms. Epoxy resins, particularly cycloaliphatic epoxies, epoxy resins combined with polyols, and vinyl ethers are examples of resins that can be radiation-cured by a cationic cure mechanism.

Photochemical generation of bases may be useful for a variety of polymerization reactions. For example, photochemically generated bases may be useful for catalyzing epoxide homopolymerization, Michael additions, and thiol- or polyol-isocyanate reactions. However, the use of photochemically generated bases to catalyze such reactions is less common than radiation curing by free-radical or cationic photoinitiators. Japanese Patent Application Publication JP2009-126974 describes a thiol-epoxide reaction catalyzed by a photogenerated base. U.S. Pat. No. 7,538,104 (Baudin et al.) describes amines with benzylic substitution that liberate amidines upon photolysis and some base-catalyzed reactions that can be catalyzed with the liberated amidine bases.

SUMMARY

Compositions and methods according to the present disclosure include a photolatent amine, camphorquinone, and a coumarin sensitizer. The photolatent amine photochemically generates an amine. The coumarin sensitizer is a triplet photosensitizer and has an absorbance with a wavelength of maximum absorbance, $\lambda_{max}$, in a range from 390 nanometers to 510 nanometers. As shown in the Examples, below, the combination of a photolatent amine, camphorquinone, and a coumarin sensitizer is surprisingly more effective for curing a base-curable material upon exposure to blue light than the photolatent amine with either the camphorquinone or coumarin photosensitizers individually.

In one aspect, the present disclosure provides a composition including a photolatent amine, camphorquinone, and a coumarin sensitizer. The coumarin sensitizer is triplet photosensitizer and has an absorbance with a wavelength of maximum absorbance in a range from 390 nanometers to 510 nanometers.

In another aspect, the present disclosure provides a polymerizable composition that includes a polymerizable material, a photolatent amine, camphorquinone, and a coumarin sensitizer. The coumarin sensitizer is a triplet photosensitizer and has an absorbance with a wavelength of maximum absorbance in a range from 390 nanometers to 510 nanometers.

In another aspect, the present disclosure provides a curable composition that includes a polythiol having more than one thiol group, a polyepoxide having more than one epoxide group, a catalytic amount of a second amine, a photolatent amine, camphorquinone, and a coumarin sensitizer. The coumarin sensitizer is a triplet photosensitizer and has an absorbance with a wavelength of maximum absorbance in a range from 390 nanometers to 510 nanometers.

In another aspect, the present disclosure provides a polymer network that can be prepared from such a curable composition, in which at least some of the thiol groups and epoxide groups have reacted to form thioether groups and hydroxyl groups.

In another aspect, the present disclosure provides a cured sealant that includes the polymer network.

In another aspect, the present disclosure provides a method of making a polymer network. The method includes exposing the curable composition described above to light having a wavelength in a range from 400 nanometers to 510 nanometers to at least partially cure the composition.

In another aspect, the present disclosure provides a method of making a polymer network. The method includes combining the composition including the photolatent amine, camphorquinone, and the coumarin sensitizer with a curable material and exposing the curable material to light having a wavelength in a range from 400 nanometers to 510 nanometers to at least partially cure the composition.

In this application:

Terms such as "a", "an" and "the" are not intended to refer to only a singular entity, but include the general class of which a specific example may be used for illustration. The terms "a", "an", and "the" are used interchangeably with the term "at least one".

The phrase "comprises at least one of" followed by a list refers to comprising any one of the items in the list and any combination of two or more items in the list. The phrase "at least one of" followed by a list refers to any one of the items in the list or any combination of two or more items in the list.

The terms "cure" and "curable" refer to joining polymer chains together by covalent chemical bonds, usually via crosslinking molecules or groups, to form a network polymer. Therefore, in this disclosure the terms "cured" and "crosslinked" may be used interchangeably. A cured or crosslinked polymer is generally characterized by insolubility, but may be swellable in the presence of an appropriate solvent.

The term "polymer or polymeric" will be understood to include polymers, copolymers (e.g., polymers formed using two or more different monomers), oligomers or monomers that can form polymers, and combinations thereof, as well as polymers, oligomers, monomers, or copolymers that can be blended.

The term "polymerizable" means able to form polymer chains (e.g., by reaction of one or more monomers).

"Alkyl group" and the prefix "alk-" are inclusive of both straight chain and branched chain groups and of cyclic groups. In some embodiments, alkyl groups have up to 30 carbons (in some embodiments, up to 20, 15, 12, 10, 8, 7, 6, or 5 carbons) unless otherwise specified. Cyclic groups can be monocyclic or polycyclic and, in some embodiments, have from 3 to 10 ring carbon atoms. Terminal "alkenyl" groups have at least 3 carbon atoms.

"Alkylene" is the multivalent (e.g., divalent or trivalent) form of the "alkyl" groups defined above.

"Arylalkylene" refers to an "alkylene" moiety to which an aryl group is attached. "Alkylarylene" refers to an "arylene" moiety to which an alkyl group is attached.

The terms "aryl" and "arylene" as used herein include carbocyclic aromatic rings or ring systems, for example, having 1, 2, or 3 rings and optionally containing at least one heteroatom (e.g., O, S, or N) in the ring optionally substituted by up to five substituents including one or more alkyl groups having up to 4 carbon atoms (e.g., methyl or ethyl), alkoxy having up to 4 carbon atoms, halo (i.e., fluoro, chloro, bromo or iodo), hydroxy, cyano, or nitro groups. Examples of aryl groups include phenyl, naphthyl, biphenyl, fluorenyl as well as furyl, thienyl, pyridyl, quinolinyl, isoquinolinyl, indolyl, isoindolyl, triazolyl, pyrrolyl, tetrazolyl, imidazolyl, pyrazolyl, oxazolyl, and thiazolyl.

All numerical ranges are inclusive of their endpoints and non-integral values between the endpoints unless otherwise stated (e.g., 1 to 5 includes 1, 1.5, 2, 2.75, 3, 3.80, 4, 5, etc.).

DETAILED DESCRIPTION

A variety of photolatent amines can be useful in the compositions and methods of the present disclosure. Many useful photolatent amines, which may be useful for practicing the present disclosure, have been reviewed in Suyama, K. and Shirai, M., "Photobase Generators: Recent Progress and Application Trend in Polymer Systems" *Progress in Polymer Science* 34 (2009) 194-209. Photolatent amines useful for practicing the present disclosure include photocleavable carbamates (e.g., 9-xanthenylmethyl, fluorenylmethyl, 4-methoxyphenacyl, 2,5-dimethylphenacyl, benzyl, and others), which have been shown to generate primary or secondary amines after photochemical cleavage and liberation of carbon dioxide. Other photolatent amines described in the review as useful for generating primary or secondary amines include certain O-acyloximes, sulfonamides, and formamides. Acetophenones, benzophenones, and acetonaphthones bearing quaternary ammonium substituents are reported to undergo photocleavage to generate tertiary amines in the presence of a variety of counter cations (borates, dithiocarbamates, and thiocyanates). Examples of these photolatent ammonium salts are N-(benzophenonemethyl)tri-N-alkyl ammonium tetraphenylborates. Certain sterically hindered α-aminoketones are also reported to generate tertiary amines.

Recently, quaternary ammonium salts made from a variety of amines and phenylglyoxylic acid have been shown to generate amines that catalyze a thiol/epoxy reaction after exposure to UV light. (See Salmi, H., et al. "Quaternary Ammonium Salts of Phenylglyoxylic acid as Photobase Generators for Thiol-Promoted Epoxide Photopolymerization" *Polymer Chemistry* 5 (2014) 6577-6583.) Such salts are also suitable as photolatent amines useful for practicing the present disclosure.

In some embodiments, the photolatent amine useful for practicing the present disclosure is a 1,3-diamine compound represented by the formula $N(R_7)(R_6)$—$CH(R_5)$—$N(R_4)$—$C(R_1)(R_2)(R_3)$ such as those described in U.S. Pat. No. 7,538,104 (Baudin et al.). Such compounds can be considered arylalkylenyl substituted reduced amidines or guanidines. In formula $N(R_7)(R_6)$—$CH(R_5)$—$N(R_4)$—$C(R_1)(R_2)(R_3)$, $R_1$ is selected from aromatic radicals, heteroaromatic radicals, and combinations thereof that absorb light in the wavelength range from 200 nm to 650 nm and that are unsubstituted or substituted one or more times by at least one monovalent group selected from alkyl, alkenyl, alkynyl, haloalkyl, —$NO_2$, —$NR_{10}R_{11}$, —CN, —$OR_{12}$, —$SR_{12}$, —$C(O)R_{13}$, —$C(O)OR_{14}$, halogen, groups of the formula $N(R_7)(R_6)$—$CH(R_5)$—$N(R_4)$—$C(R_2)(R_3)$— where $R_2$-$R_7$ are as defined below, and combinations thereof, and that upon absorption of light in the wavelength range from 200 nm to 650 nm bring about a photoelimination that generates an amidine or guanidine. $R_2$ and $R_3$ are each independently selected from hydrogen, alkyl, phenyl, substituted phenyl (that is, substituted one or more times by at least one monovalent group selected from alkyl, —CN, —$OR_{12}$, —$SR_{12}$, halogen, haloalkyl, and combinations thereof), and combinations thereof; $R_5$ is selected from alkyl, —$NR_8R_9$, and combinations thereof; $R_4$, $R_6$, $R_7$, $R_8$, $R_9$, $R_{10}$ and $R_{11}$ are each independently selected from hydrogen, alkyl, and combinations thereof; or $R_4$ and $R_6$ together form a $C_2$-$C_{12}$ alkylene bridge that is unsubstituted or is substituted by one or more monovalent groups selected from $C_1$-$C_4$ alkyl radicals and combinations thereof; or $R_5$ and $R_7$, independently of $R_4$ and $R_6$, together form a $C_2$-$C_{12}$ alkylene bridge that is unsubstituted or is substituted by one or more monovalent groups selected from $C_1$-$C_4$ alkyl radicals and combinations thereof; or, if $R_5$ is —$NR_8R_9$, then $R_7$ and $R_9$ together form a $C_2$-$C_{12}$ alkylene bridge that is unsubstituted or is substituted by one or more monovalent groups selected from $C_1$-$C_4$ alkyl radicals and combinations thereof; and $R_{12}$, $R_{13}$, and $R_{14}$ are each independently selected from hydrogen, alkyl, and combinations thereof. Any of the alkyl and haloalkyl groups above can be linear or branched and, in some embodiments, contain 1 to about 19 carbon atoms (in some embodiments, 1 to about 18, 1 to about 12, or 1 to about 6 carbon atoms). In some embodiments, halogen atoms are chlorine, fluorine, and/or bromine (in some embodiments, chlorine and/or fluorine). The alkenyl groups can be linear or branched and, in some embodiments, contain 2 to about 18 carbon atoms (in some embodiments, 2 to about 12 or 2 to about 6 carbon atoms). The alkynyl groups can be linear or branched and, in some embodiments, contain 2 to about 18 carbon atoms (in some embodiments, 2 to about 12 or 2 to about 6 carbon atoms).

In some embodiments of formula $N(R_7)(R_6)$—$CH(R_5)$—$N(R_4)$—$C(R_1)(R_2)(R_3)$, $R_1$ is selected from substituted and unsubstituted phenyl, naphthyl, phenanthryl, anthryl, pyrenyl, 5,6,7,8-tetrahydro-2-naphthyl, 5,6,7,8-tetrahydro-1-naphthyl, thienyl, benzo[b]thienyl, naphtho[2,3-b]thienyl, thianthrenyl, anthraquinonyl, dibenzofuryl, chromenyl, xanthenyl, thioxanthyl, phenoxathiinyl, pyrrolyl, imidazolyl, pyrazolyl, pyrazinyl, pyrimidinyl, pyridazinyl, indolizinyl, isoindolyl, indolyl, indazolyl, purinyl, quinolizinyl, isoquinolyl, quinolyl, phthalazinyl, naphthyridinyl, quinoxalinyl, quinazolinyl, cinnolinyl, pteridinyl, carbazolyl, β-carbolinyl, phenanthridinyl, acridinyl, perimidinyl, phenanthrolinyl, phenazinyl, isothiazolyl, phenothiazinyl, isoxazolyl, furazanyl, terphenyl, stilbenyl, fluorenyl, phenoxazinyl, and combinations thereof, any of these being unsubstituted or substituted one or more times by $C_1$-$C_{18}$ alkyl, $C_2$-$C_{18}$ alkenyl, $C_2$-$C_{18}$ alkenyl, $C_1$-$C_{18}$ haloalkyl, —$NO_2$, —$NR_{10}R_{11}$, —CN, —$OR_{12}$, —$SR_{12}$, —$C(O)R_{13}$, —$C(O)OR_{14}$, halogen, a radical of the formula $N(R_7)(R_6)$—$CH(R_5)$—$N(R_4)$—$C(R_2)(R_3)$—, or a combination thereof, where $R_2$-$R_7$ and $R_{10}$-$R_{14}$ are as defined above. In some embodiments of formula $N(R_7)(R_6)$—$CH(R_5)$—$N(R_4)$—$C(R_1)(R_2)(R_3)$, $R_1$ is a substituted or unsubstituted biphenylyl radical, wherein each phenyl group is independently substituted with from zero to three (preferably, zero or one) substituents selected from $C_1$-$C_{18}$ alkyl, $C_2$-$C_{18}$ alkenyl, —OH, —CN, —$OR_{10}$, —$SR_{10}$, halogen, radicals of the formula $N(R_7)(R_6)$—$CH(R_5)$—$N(R_4)$—$C(R_2)(R_3)$—, and combinations thereof, where $R_2$-$R_7$ and $R_{10}$-$R_{14}$ are as defined above. In some embodiments of formula N(R$_7$)(R$_6$)—CH(R$_5$)—N(R$_4$)—C(R$_1$)(R$_2$)(R$_3$), R$_1$ is selected from phenyl, 3-methoxyphenyl, 4-methoxyphenyl, 2,4,6-trimethoxyphenyl, 2,4-dimethoxyphenyl, and combinations thereof.

In some embodiments of formula N(R$_7$)(R$_6$)—CH(R$_5$)—N(R$_4$)—C(R$_1$)(R$_2$)(R$_3$), R$_2$ and R$_3$ each are independently selected from hydrogen, C$_1$-C$_6$ alkyl, and combinations thereof (in some embodiments, both are hydrogen); R$_4$ and R$_6$ together form a C$_2$-C$_6$ alkylene (in some embodiments, C$_3$ alkylene) bridge that is unsubstituted or is substituted by one or more groups selected from C$_1$-C$_4$ alkyl radicals and combinations thereof; and/or R$_5$ and R$_2$ together form a C$_2$-C$_6$ alkylene (in some embodiments, C$_3$ or C$_5$ alkylene) bridge that is unsubstituted or is substituted by one or more groups selected from C$_1$-C$_4$ alkyl radicals and combinations thereof, or, if R$_5$ is —NR$_8$R$_9$, R$_9$ and R$_7$ together form a C$_2$-C$_6$ alkylene bridge that is unsubstituted or substituted by one or more groups selected from C$_1$-C$_4$ alkyl radicals and combinations thereof.

In some embodiments, the photolatent amine comprises at least one compound represented by formula

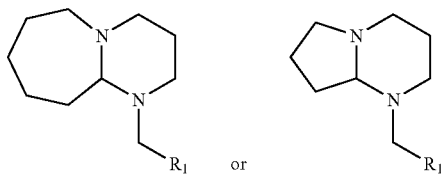

wherein R$_1$ is phenyl, naphthyl, or anthracenyl, each of which is unsubstituted or substituted by at least one substituent selected from the group consisting of methyl, cyano, nitro, ethenyl, or chloro. In these embodiments, the photolatent amine photochemically generates 1,8-diazabicyclo[5.4.0]undec-7-ene (DBU) or 1,5-diazabicyclo[4.3.0]non-5-ene (DBN).

Examples of suitable photolatent amines useful for practicing the present disclosure include 5-benzyl-1,5-diazabicyclo[4.3.0]nonane, 5-(anthracen-9-yl-methyl)-1,5-diaza[4.3.0]nonane, 5-(2'-nitrobenzyl)-1,5-diazabicyclo[4.3.0]nonane, 5-(4'-cyanobenzyl)-1,5-diazabicyclo[4.3.0]nonane, 5-(3'-cyanobenzyl)-1,5-diazabicyclo[4.3.0]nonane, 5-(anthraquinon-2-yl-methyl)-1,5-diaza[4.3.0]nonane, 5-(2'-chlorobenzyl)-1,5-diazabicyclo[4.3.0]nonane, 5-(4'-methylbenzyl)-1,5-diazabicyclo[4.3.0]nonane, 5-(2',4',6'-trimethylbenzyl)-1,5-diazabicyclo[4.3.0]nonane, 5-(4'-ethenylbenzyl)-1,5-diazabicyclo[4.3.0]nonane, 5-(3'-trimethylbenzyl)-1,5-diazabicyclo[4.3.0]nonane, 5-(2',3'-dichlorobenzyl)-1,5-diazabicyclo[4.3.0]nonane, 5-(naphth-2-yl-methyl-1,5-diazabicyclo[4.3.0]nonane, 1,4-bis(1,5-diazabicyclo[4.3.0]nonanylmethyl)benzene, 8-benzyl-1,8-diazabicyclo[5.4.0]undecane, 8-benzyl-6-methyl-1,8-diazabicyclo[5.4.0]undecane, 9-benzyl-1,9-diazabicyclo[6.4.0]dodecane, 10-benzyl-8-methyl-1,10-diazabicyclo[7.4.0]tridecane, 11-benzyl-1,11-diazabicyclo[8.4.0]tetradecane, 8-(2'-chlorobenzyl)-1,8-diazabicyclo[5.4.0]undecane, 8-(2',6'-dichlorobenzyl)-1,8-diazabicyclo[5.4.0]undecane, 4-(diazabicyclo[4.3.0]nonanylmethyl)-1,1'-biphenyl, 4,4'-bis(diazabicyclo[4.3.0]nonanylmethyl)-11'-biphenyl, 5-benzyl-2-methyl-1,5-diazabicyclo[4.3.0]nonane, 5-benzyl-7-methyl-1,5,7-triazabicyclo[4.4.0]decane, and combinations thereof. Such compounds can be made, for example, using the methods described in U.S. Pat. No. 7,538,104 (Baudin et al.), assigned to BASF, Ludwigshafen, Germany. An example of a photolatent amine is available from BASF under the trade designation "CGI-90", which is reported to be 5-benzyl-1,5-diazabicyclo[4.3.0]nonane (see, e.g., WO 2014/176490 (Knapp et al.)), which generates 1,5-diazabicyclo[4.3.0]non-5-ene (DBN) upon exposure to actinic radiation (see, e.g., US2013/0345389 (Cai et al.)).

Other suitable photolatent amines useful for the compositions according to the present disclosure and/or for practicing the methods disclosed herein include those described in U.S. Pat. No. 6,410,628 (Hall-Goulle et al.), U.S. Pat. No. 6,087,070 (Turner et al.), U.S. Pat. No. 6,124,371 (Stanssens et al.), and U.S. Pat. No. 6,057,380 (Birbaum et al.), and U.S. Pat. Appl. Pub. No. 2011/01900412 (Studer et al.).

In some embodiments, useful photolatent amines absorb light in a wavelength range from 200 nm to 650 nm. Compositions according to the present disclosure (which include the photolatent amine) include photosensitizers that absorb light in or near the blue light region, for example, in a wavelength range from 400 nm to 510 nm or 400 nm to 500 nm. Blue light can be considered, in some embodiments to have a wavelength range of 420 nm to 495 nm.

Compositions according to the present disclosure and/or useful for practicing the methods according to the present disclosure further include photosensitizers: camphorquinone and at least one coumarin triplet photosensitizer that has an absorbance with a wavelength of maximum absorbance in a range from 390 nanometers to 510 nanometers. As used herein, photosensitizers may be understood to be compounds that when used in conjunction with the photolatent amine, improve or allow the photocatalysis or photoinitiation of a base-catalyzed polymerization and/or curing reaction relative to the use of the photolatent amine alone upon irradiation with light of the wavelength of interest; in this case 390 nm to 510 nm or 400 nm to 500 nm. As used herein, a photosensitizer may be understood to be, for example, a compound having an absorption spectrum that overlaps or closely matches the emission spectrum of the radiation source to be used and that can, for example, improve the energy transfer to the photolatent amine. The use of the term "photosensitizer" above does not imply a specific mechanism. One of the photosensitizers in the compositions according to the present disclosure is camphorquinone. The composition further includes at least one coumarin with a wavelength of maximum absorbance, between 390 to 510 nm and is an efficient triplet photosensitizer. Since $\lambda_{max}$ may have a slight solvent dependence, the most pertinent determination of $\lambda_{max}$ is at room temperature in a material that desired to be cured. For the purposes of this disclosure, coumarins that are efficient triplet photosensitizers are those that have an intersystem crossing quantum yield, $\phi_{isc}$, of at least 0.3, at least 0.4, at least 0.5, at least 0.6, at least 0.7, at least 0.8, or at least 0.9 when measured in benzene as described, for example, in *Tetrahedron*, vol. 38, no. 9, pp. 1203-1211 (1982). In general, a molecule that is photoexcited from its ground state, S$_0$, to its singlet state, S$_1$, can undergo three different photophysical processes from the singlet state, S$_1$. These are radiative decay from S$_1$ to S$_0$ (fluorescence, fl), non-radiative decay from S$_1$ to S$_0$ (internal conversion, ic), and intersystem crossing from the singlet state, S$_1$, to the triplet state, T$_1$ (intersystem crossing, isc). The intersystem crossing quantum yield, $\phi_{isc}$, is defined as the ratio of the rate constant for intersystem crossing from S$_1$ to T$_1$, k$_{isc}$, divided by the sum of the rate constants for all three photophysical processes, i.e., $\phi_{isc}=k_{isc}/(k_{fl}+k_{ic}+k_{isc})$, devoid of any chemical reactions occurring from the singlet state, S$_1$. Since all three photophysical processes originate from the singlet state, $S_1$, the intersystem crossing quantum yield, $\phi_{isc}$, can be considered the fraction of molecules in the singlet state that undergo intersystem crossing to the triplet state.

Examples of coumarins useful for practicing the present disclosure are described in *Tetrahedron*, vol. 38, no. 9, pp. 1203-1211 (1982), and include 3,3'-carbonylbis(5,7-dimethoxycoumarin), 3-benzoyl-7-diethylaminocoumarin, 7-diethylamino-3-thenoylcoumarin, 3-(2-benzofuroyl)-7-diethylaminocoumarin, 7-diethylamino-5',7'-dimethoxy-3,3'-carbonylbiscoumarin, 3,3'-carbonylbis(7-diethylaminocoumarin), 9-(7-diethylamino-3-coumarinoyl)-1,2,4,5-tetrahydro-3H,6H,10H[1]benzopyrano[9,9a,1-gh]quinolazine-10-one, and 9,9'-carbonylbis(1,2,4,5-tetrahydro-3H,6H,10H[1]benzopyrano[9,9a,1-gh]quinolazine-10-one). Coumarins that have a $\lambda_{max}$ between 390 to 510 nm and intersystem crossing quantum yield of at least 0.5 include 3,3'-carbonylbis(5,7-dimethoxycoumarin), 7-diethylamino-3-thenoylcoumarin, 3-(2-benzofuroyl)-7-diethylaminocoumarin, 3,3'-carbonylbis(7-diethylaminocoumarin), and 9,9'-carbonylbis(1,2,4,5-tetrahydro-3H,6H,10H[1]benzopyrano[9,9a,1-gh]quinolazine-10-one). Coumarins that have a $\lambda_{max}$ between 400 to 500 nm and intersystem crossing quantum yield of at least 0.6 include 7-diethylamino-3-thenoylcoumarin, 3-(2-benzofuroyl)-7-diethylaminocoumarin, 3,3'-carbonylbis(7-diethylaminocoumarin), and 9,9'-carbonylbis(1,2,4,5-tetrahydro-3H,6H,10H[1]benzopyrano[9,9a,1-gh]quinolazine-10-one). In some embodiments, the coumarin sensitizer comprises at least one of 3,3'-carbonylbis(7-diethylaminocoumarin) or 7-diethylamino-3-thenoylcoumarin.

In some embodiments, a weight ratio of photolatent amine to a combined weight of camphorquinone and coumarin is in a range from 0.5:1 to 10:1 or 1:1 to 5:1. In some embodiments, a weight ratio of camphorquinone to coumarin is in range from 0.5:1 to 10:1, 1:1 to 10:1, or 1:1 to 5:1.

In the Examples described below, the use of only the coumarins, 3,3'-carbonylbis(7-diethylaminocoumarin) or 7-diethylamino-3-thenoylcoumarin, in conjunction with the photolatent amine obtained under the trade designation "CGI-90" from BASF, is considerably less effective than use of camphorquinone with "CGI-90" in the photoinitiation and/or photocatalysis of the curing of curable material comprising a polythiol and polyepoxide when utilizing light with a wavelength range from 430 nm to 480 nm and peak intensity in a range from 444 to 452 nm. See, for example, Comparative Examples C vs. D and G vs. F, which show that camphorquinone is a significantly more effective photosensitizer. Thus, it is unexpected that combining these coumarins with camphorquinone affords a significant improvement in the photoinitiation and/or photocatalysis as shown in Table 7, which shows that the combination of photosensitizers in the compositions according to the present disclosure leads to initial gel formation and gel formation of the bulk of the polythiol-polyepoxide in half the time or less than each of the photosensitizers alone. It is particularly unexpected since the coumarins are effectively competing for the same photons as those absorbed by camphorquinone given the narrow wavelength range of the light and the similar absorption of the coumarins and camphorquinone. For example, the maximum absorbance of camphorquinone in benzene is 467 nm (*Biomaterials*, vol. 24, pp. 2097-2103 (2003)) and that of 3,3'-carbonylbis(7-diethylaminocoumarin) in benzene is 449 nm (*Tetrahedron*, vol. 38, no. 9, pp. 1203-1211 (1982)). The benefit provided by the combination of camphorquinone and the particular coumarins in the compositions of the present disclosure is not observed with the combination of camphorquinone and other coumarins. As shown in a comparison of Comparative Examples N and D, the addition of Coumarin 314, which is not a triplet photosensitizer, does not provide an improvement in photoinitiation and/or photocatalysis in comparison to camphorquinone alone.

In some embodiments, compositions according to the present disclosure, which include a photolatent amine, camphorquinone, and a coumarin, are polymerizable compositions that further comprise a polymerizable material (e.g., amine-curable material). In some embodiments, the polymerizable material is a curable material. The polymerizable material or curable material may include low molecular mass compounds (monomers), oligomers, polymeric compounds, or a mixture of such compounds. Examples of materials that may be polymerized or cured using the combination of photolatent amine, camphorquinone, and coumarin disclosed herein are those that contain a polyepoxide or a polyisocyanate. Polymerizable compositions containing polyepoxides may include polyepoxides as the only curable component or they can contain compounds that react with the polyepoxides such as polyamines, polyols, polycarboxylic acids, polythiols, and combinations thereof. Polymerizable compositions including polyisocyanates also include a compound capable of reacting with the polyisocyanate, such as polyamines, polyols, polycarboxylic acids, polythiols, and combinations thereof.

In some embodiments, polymerizable compositions according to the present disclosure in any of the embodiments described above and below include the photolatent amine in an amount from 0.1 percent to 10.0 percent by weight, based on the total weight of the polymerizable material in the composition. In some embodiments, the photolatent amine is included in the composition in an amount from 0.5 percent to 10 percent, or 0.5 percent to 5 percent by weight, or 1 to 5 percent by weight, based on the total weight of the composition. The amount of camphorquinone and coumarin can vary depending upon, for example, the nature of other component(s) of the photoactivatable composition, and the particular curing conditions. For example, combined amounts of camphorquinone and coumarin ranging from about 0.1 weight percent to about 10 weight percent can be useful for some applications. In some embodiments, the camphorquinone and coumarin are included in the composition in a combined amount from 0.5 percent to 10 percent by weight, 0.5 percent to 7.5 percent by weight, 0.5 percent to 5 percent, 0.5 to 2 percent, 0.5 percent to 1 percent, or 1 percent to 5 percent by weight, based on the total weight of the polymerizable components.

In some embodiments, the composition according to the present disclosure, which include a photolatent amine, camphorquinone, and a coumarin, are curable compositions that further comprise a polythiol having more than one thiol group and a polyepoxide having more than one epoxide group. In some embodiments, the polythiol includes at least two thiol groups, and the polyepoxide includes at least two epoxide groups. Generally, in order to achieve chemical crosslinking between polymer chains, greater than two thiol groups and/or greater than two epoxide groups are present in at least some of the polythiol and polyepoxide molecules, respectively. When using a polythiol having two thiol groups, for example, a mixture of polyepoxides may be useful in which at least one polyepoxide has two epoxide groups, and at least one polyepoxide has at least three epoxide groups. Mixtures of polyepoxides and/or polythiols having at least 5 percent functional equivalents of epoxide groups contributed by polyepoxides having at least three epoxide groups or thiol groups contributed by polythiols having at least three thiol groups may be useful.

A variety of polythiols having more than one thiol group and polyepoxides having more than one epoxide group are useful in the composition according to the present disclosure. In some embodiments, the polythiol is monomeric. In these embodiments, the polythiol may be an alkylene, arylene, alkylarylene, arylalkylene, or alkylenearylalkylene having at least two mercaptan groups, wherein any of the alkylene, alkylarylene, arylalkylene, or alkylenearylalkylene are optionally interrupted by one or more ether (i.e., —O—), thioether (i.e., —S—), or amine (i.e., —NR$^1$—) groups and optionally substituted by alkoxy or hydroxyl. Useful monomeric polythiols may be dithiols or polythiols with more than 2 (in some embodiments, 3 or 4) mercaptan groups. In some embodiments, the polythiol is an alkylene dithiol in which the alkylene is optionally interrupted by one or more ether (i.e., —O—) or thioether (i.e., —S—) groups. Examples of useful dithiols include 1,2-ethanedithiol, 1,2-propanedithiol, 1,3-propanedithiol, 1,3-butanedithiol, 1,4-butanedithiol, 2,3-butanedithiol, 1,3-pentanedithiol, 1,5-pentanedithiol, 1,6-hexanedithiol, 1,3-dimercapto-3-methylbutane, dipentenedimercaptan, ethylcyclohexyldithiol (ECHDT), dimercaptodiethylsulfide, methyl-substituted dimercaptodiethylsulfide, dimethyl-substituted dimercaptodiethylsulfide, dimercaptodioxaoctane, 1,5-dimercapto-3-oxapentane and mixtures thereof. Examples of polythiols having more than two mercaptan groups include propane-1,2,3-trithiol; 1,2-bis[(2-mercaptoethyl)thio]-3-mercaptopropane; tetrakis(7-mercapto-2,5-dithiaheptyl)methane; and trithiocyanuric acid. Combinations of any of these or with any of the dithiols mentioned above may be useful.

In some embodiments, the polythiol in the curable composition according to the present disclosure is oligomeric or polymeric. Examples of useful oligomeric or polymeric polythiols include polythioethers and polysulfides. Polythioethers include thioether linkages (i.e., —S—) in their backbone structures. Polysulfides include disulfide linkages (i.e., —S—S—) in their backbone structures.

Polythioethers can be prepared, for example, by reacting dithiols with dienes, diynes, divinyl ethers, diallyl ethers, ene-ynes, or combinations of these under free-radical conditions. Useful dithiols include any of the dithiols listed above. Examples of suitable divinyl ethers include divinyl ether, ethylene glycol divinyl ether, butanediol divinyl ether, hexanediol divinyl ether, diethylene glycol divinyl ether, triethylene glycol divinyl ether, tetraethylene glycol divinyl ether, cyclohexanedimethanol divinyl ether, polytetrahydrofuryl divinyl ether, and combinations of any of these. Useful divinyl ethers of formula $CH_2$=CH—O—(—R$^2$—O—)$_m$CH=CH$_2$, in which m is a number from 0 to 10 and R$^2$ is a C$_2$ to C$_6$ branched alkylene can be prepared by reacting a polyhydroxy compound with acetylene. Examples of compounds of this type include compounds in which R$^2$ is an alkyl-substituted methylene group such as —CH(CH$_3$)— (e.g., those obtained from BASF, Florham Park, N.J., under the trade designation "PLURIOL", for which R$^2$ is ethylene and m is 3.8) or an alkyl-substituted ethylene (e.g., —CH$_2$CH(CH$_3$)— such as those obtained from International Specialty Products of Wayne, N.J., under the trade designation "DPE" (e.g., "DPE-2" and "DPE-3"). Examples of other suitable dienes, diynes, and diallyl ethers include 4-vinyl-1-cyclohexene, 1,5-cyclooctadiene, 1,6-heptadiyne, 1,7-octadiyne, and diallyl phthalate. Small amounts trifunctional compounds (e.g., triallyl-1,3,5-triazine-2,4,6-trione, 2,4,6-triallyloxy-1,3,5-triazine, or or 1,2,4-trivinylcyclohexane) may also be useful in the preparation of oligomers.

Examples of oligomeric or polymeric polythioethers useful for practicing the present disclosure are described, for example, in U.S. Pat. No. 4,366,307 (Singh et al.), U.S. Pat. No. 4,609,762 (Morris et al.), U.S. Pat. No. 5,225,472 (Cameron et al.), U.S. Pat. No. 5,912,319 (Zook et al.), U.S. Pat. No. 5,959,071 (DeMoss et al.), U.S. Pat. No. 6,172,179 (Zook et al.), and U.S. Pat. No. 6,509,418 (Zook et al.). In some embodiments, the polythioether is represented by formula HS—R$^3$—[S—(CH$_2$)$_2$—O—[—R$^4$—O—]$_m$—(CH$_2$)$_2$—S—R$^3$—]$_n$—SH, wherein each R$^3$ and R$^4$ is independently a C$_{2-6}$ alkylene, wherein alkylene may be straight-chain or branched, C$_{6-8}$ cycloalkylene, C$_{6-10}$ alkylcycloalkylene, —[(CH$_2$—)$_p$—X—]$_q$(—CH$_2$—)$_r$, in which at least one —CH$_2$— is optionally substituted with a methyl group, X is selected from the group consisting of O, S and —NR$^5$—, R$^5$ denotes hydrogen or methyl, m is a number from 0 to 10, n is a number from 1 to 60, p is an integer from 2 to 6, q is an integer from 1 to 5, and r is an integer from 2 to 10. Polythioethers with more than two mercaptan groups may also be useful.

In some embodiments, a free-radical initiator is combined with the dithiols with dienes, diynes, divinyl ethers, diallyl ethers, ene-ynes, or combinations of these, and the resulting mixture is heated to provide the polythioethers. Examples of suitable free-radical initiators include azo compounds (e.g., 2,2'-azobisisobutyronitrile (AIBN), 2,2'-azobis(2-methylbutyronitrile), or azo-2-cyanovaleric acid). In some embodiments, the free-radical initiator is an organic peroxide. Examples of useful organic peroxides include hydroperoxides (e.g., cumene, tert-butyl or tert-amyl hydroperoxide), dialkyl peroxides (e.g., di-tert-butylperoxide, dicumylperoxide, or cyclohexyl peroxide), peroxyesters (e.g., tert-butyl perbenzoate, tert-butyl peroxy-2-ethylhexanoate, tert-butylperoxy-3,5,5-trimethylhexanoate, tert-butyl monoperoxymaleate, or di-tert-butyl peroxyphthalate), peroxycarbonates (e.g., tert-butylperoxy 2-ethylhexylcarbonate, tert-butylperoxy isopropyl carbonate, or di(4-tert-butylcyclohexyl) peroxydicarbonate), ketone peroxides (e.g., methyl ethyl ketone peroxide, 1,1-di(tert-butylperoxy)cyclohexane, 1,1-di(tert-butylperoxy)-3,3,5-trimethylcyclohexane, and cyclohexanone peroxide), and diacylperoxides (e.g., benzoyl peroxide or lauryl peroxide). The organic peroxide may be selected, for example, based on the temperature desired for use of the organic peroxide and compatibility with the monomers. Combinations of two or more organic peroxides may also be useful.

The free-radical initiator useful for making a polythioether may also be a photoinitiator. Examples of useful photoinitiators include benzoin ethers (e.g., benzoin methyl ether or benzoin butyl ether); acetophenone derivatives (e.g., 2,2-dimethoxy-2-phenylacetophenone or 2,2-diethoxyacetophenone); 1-hydroxycyclohexyl phenyl ketone; and acylphosphine oxide derivatives and acylphosphonate derivatives (e.g., bis(2,4,6-trimethylbenzoyl)phenylphosphine oxide, diphenyl-2,4,6-trimethylbenzoylphosphine oxide, isopropoxyphenyl-2,4,6-trimethylbenzoylphosphine oxide, or dimethyl pivaloylphosphonate). Many photoinitiators are available, for example, from BASF under the trade designation "IRGACURE". The photoinitiator may be selected, for example, based on the desired wavelength for curing and compatibility with the monomers. When using a photoinitiator, the polythioether is typically prepared using an actinic light source (e.g., at least one of a blue light source or a UV light source).

Polythioethers can also be prepared, for example, by reacting dithiols with diepoxides, which may be carried out by stirring at room temperature, optionally in the presence of a tertiary amine catalyst (e.g., 1,4-diazabicyclo[2.2.2]octane (DABCO)). Useful dithiols include any of those described above. Useful epoxides can be any of those having two epoxide groups. In some embodiments, the diepoxide is a bisphenol diglycidyl ether, wherein the bisphenol (i.e., —O—$C_6H_5$—$CH_2$—$C_6H_5$—O—) may be unsubstituted (e.g., bisphenol F), or either of the phenyl rings or the methylene group may be substituted by halogen (e.g., fluoro, chloro, bromo, iodo), methyl, trifluoromethyl, or hydroxymethyl. Polythioethers prepared from dithiols and diepoxides have pendent hydroxyl groups and can have structural repeating units represented by formula —S—$R^3$—S—$CH_2$—CH(OH)—$CH_2$—O—$C_6H_5$—$CH_2$—$C_6H_5$—O—$CH_2$—CH(OH)—$CH_2$—S—$R^3$—S—, wherein $R^3$ is as defined above, and the bisphenol (i.e., —O—$C_6H_5$—$CH_2$—$C_6H_5$—O—) may be unsubstituted (e.g., bisphenol F), or either of the phenyl rings or the methylene group may be substituted by halogen (e.g., fluoro, chloro, bromo, iodo), methyl, trifluoromethyl, or hydroxymethyl. Mercaptan terminated polythioethers of this type can also be reacted with any of the dienes, diynes, divinyl ethers, diallyl ethers, and ene-ynes listed above under free radical conditions. Any of the free-radical initiators and methods described above may be useful for preparing the polythioethers. In some embodiments, the thermal initiators described above are used, and the resulting mixture is heated to provide the polythioethers.

Polysulfides are typically prepared by the condensation of sodium polysulfide with bis-(2-chloroethyl) formal, which provides linear polysulfides having two terminal mercaptan groups. Branched polysulfides having three or more mercaptan groups can be prepared using trichloropropane in the reaction mixture. Examples of useful polysulfides are described, for example, in U.S. Pat. No. 2,466,963 (Patrick et al); U.S. Pat. No. 2,789,958 (Fettes et al); U.S. Pat. No. 4,165,425 (Bertozzi); and U.S. Pat. No. 5,610,243 (Vietti et al). Poly sulfides are commercially available under the trademarks "THIOKOL" and "LP" from Toray Fine Chemicals Co., Ltd., Urayasu, Japan and are exemplified by grades "LP-2", "LP-2C" (branched), "LP-3", "LP-33", and "LP-541".

Polythioethers and polysulfides can have a variety of useful molecular weights. In some embodiments, the polythioethers and polysulfides have number average molecular weights in a range from 500 grams per mole to 20,000 grams per mole, 1,000 grams per mole to 10,000 grams per mole, or 2,000 grams per mole to 5,000 grams per mole.

A variety of polyepoxides having more than one epoxide group are useful in the composition according to the present disclosure. In some embodiments, the polyepoxide is monomeric. In some embodiments, the polyepoxide is oligomeric or polymeric (that is, an epoxy resin). A monomeric polyepoxide may be an alkylene, arylene, alkylarylene, arylalkylene, or alkylenearylalkylene having at least two epoxide groups, wherein any of the alkylene, alkylarylene, arylalkylene, or alkylenearylalkylene are optionally interrupted by one or more ether (i.e., —O—), thioether (i.e., —S—), or amine (i.e., —$NR^1$—) groups and optionally substituted by alkoxy, hydroxyl, or halogen (e.g., fluoro, chloro, bromo, iodo). Useful monomeric polyepoxides may be diepoxides or polyepoxides with more than 2 (in some embodiments, 3 or 4) epoxide groups. An epoxy resin may be prepared by chain-extending any of such polyepoxides.

Some useful polyepoxides are aromatic. Useful aromatic polyepoxides and epoxy resins typically contain at least one (in some embodiments, at least 2, in some embodiments, in a range from 1 to 4) aromatic ring (e.g., phenyl group) that is optionally substituted by a halogen (e.g., fluoro, chloro, bromo, iodo), alkyl having 1 to 4 carbon atoms (e.g., methyl or ethyl), or hydroxyalkyl having 1 to 4 carbon atoms (e.g., hydroxymethyl). For polyepoxides and epoxy resin repeating units containing two or more aromatic rings, the rings may be connected, for example, by a branched or straight-chain alkylene group having 1 to 4 carbon atoms that may optionally be substituted by halogen (e.g., fluoro, chloro, bromo, iodo). In some embodiments, the aromatic polyepoxide or epoxy resin is a novolac. In these embodiments, the novolac epoxy may be a phenol novolac, an ortho-, meta-, or para-cresol novolac, or a combination thereof. In some embodiments, the aromatic polyepoxide or epoxy resin is a bisphenol diglycidyl ether, wherein the bisphenol (i.e., —O—$C_6H_5$—$CH_2$—$C_6H_5$—O—) may be unsubstituted (e.g., bisphenol F), or either of the phenyl rings or the methylene group may be substituted by halogen (e.g., fluoro, chloro, bromo, iodo), methyl, trifluoromethyl, or hydroxymethyl. In some embodiments, the polyepoxide is a novolac epoxy resin (e.g., phenol novolacs, ortho-, meta-, or para-cresol novolacs or combinations thereof), a bisphenol epoxy resin (e.g., bisphenol A, bisphenol F, halogenated bisphenol epoxies, and combinations thereof), a resorcinol epoxy resin, and combinations of any of these. Examples of useful aromatic monomeric polyepoxides include the diglycidyl ethers of bisphenol A and bisphenol F and tetrakis glycidyl-4-phenylolethane and mixtures thereof.

Some useful polyepoxides are non-aromatic. The non-aromatic epoxy can include a branched or straight-chain alkylene group having 1 to 20 carbon atoms optionally interrupted with at least one —O— and optionally substituted by hydroxyl. In some embodiments, the non-aromatic epoxy can include a poly(oxyalkylene) group having a plurality (x) of oxyalkylene groups, $OR^1$, wherein each $R^1$ is independently $C_2$ to $C_5$ alkylene, in some embodiments, $C_2$ to $C_3$ alkylene, x is 2 to about 6, 2 to 5, 2 to 4, or 2 to 3. Examples of useful non-aromatic monomeric polyepoxides include ethylene glycol diglycidyl ether, propylene glycol diglycidyl ether, diethylene glycol diglycidyl ether, dipropylene glycol diglycidyl ether, polyethylene glycol diglycidyl ether, polypropylene glycol diglycidyl ether, glycerol diglycidyl ether, propanediol diglycidyl ether, butanediol diglycidyl ether, and hexanediol diglycidyl ether. Examples of useful polyepoxides having more than two epoxide groups include glycerol triglycidyl ether, and polyglycidyl ethers of 1,1,1-trimethylolpropane, pentaerythritol, and sorbitol. Other examples of useful polyepoxides include glycidyl ethers of cycloaliphatic alcohols (e.g., 1,4-cyclohexanedimethanol, bis(4-hydroxycyclohexyl)methane or 2,2-bis(4-hydroxycyclohexyl)propane), cycloaliphatic epoxy resins (e.g., bis(2,3-epoxycyclopentyl) ether, 2,3-epoxycyclopentyl glycidyl ether, 1,2-bis(2,3-epoxycyclopentyloxy)ethane and 3,4-epoxycyclohexylmethyl 3',4'-epoxycyclohexanecarboxylate), and hydantoin diepoxide. Examples of polyepoxides having amine groups include poly(N-glycidyl) compounds obtainable by dehydrochlorinating the reaction products of epichlorohydrin with amines containing at least two amine hydrogen atoms. These amines are, for example, aniline, n-butylamine, bis(4-aminophenyl) methane, m-xylylenediamine or bis(4-methylaminophenyl) methane. Examples of polyepoxides having thioether groups include di-S-glycidyl derivatives of dithiols (e.g., ethane-1, 2-dithiol or bis(4-mercaptomethylphenyl) ether).

In some embodiments of compositions according to the present disclosure and/or useful in the methods according to the present disclosure, the polyepoxide is an oligomeric or polymeric diepoxide. In some embodiments, epoxides may be chain extended to have any desirable epoxy equivalent weight. Chain extending epoxy resins can be carried out by reacting a monomeric diepoxide, for example, with a diol in the presence of a catalyst to make a linear polymer. In some embodiments, the resulting epoxy resin (e.g., either an aromatic or non-aromatic epoxy resin) may have an epoxy equivalent weight of at least 150, 170, 200, or 225 grams per equivalent. In some embodiments, the aromatic epoxy resin may have an epoxy equivalent weight of up to 2000, 1500, or 1000 grams per equivalent. In some embodiments, the aromatic epoxy resin may have an epoxy equivalent weight in a range from 150 to 2000, 150 to 1000, or 170 to 900 grams per equivalent. Epoxy equivalent weights may be selected, for example, so that the epoxy resin may be used as a liquid. Other epoxy resins can be made using a deficient amount of epichlorohydrin with a diol (e.g., Bisphenol A) in a caustic catalyzed synthetic reaction.

Mixtures of polythiols and mixtures of polyepoxides, including any of those described above, may also be useful. Typically the amounts of the polythiol(s) and polyepoxide(s) are selected for the curable composition so that there is a stoichiometric equivalence of thiol (i.e., mercaptan) groups and epoxide groups. In some embodiments, the ratio of thiol groups to epoxide groups is in a range from 0.8:1 to 1.2:1.

Compositions and methods according to the present disclosure include a photolatent amine. A photolatent amine photochemically generates an amine that can catalyze the reaction between a polythiol and the polyepoxide or other components of a polymerizable composition. In the compositions and methods disclosed herein, the photochemically generated amine is a first amine. In some embodiments, polymerizable compositions according to the present disclosure, which include a polymerizable material, also include a second amine. In some embodiments, the second amine is different from the first amine. In some embodiments, the first amine and the second amine are the same amine.

The first amine and second amine can independently be any compound including one to four basic nitrogen atoms that bear a lone pair of electrons. The first amine and second amine can independently include primary, secondary, and tertiary amine groups. The nitrogen atom(s) in the first amine and second amine can be bonded to alkyl groups, aryl groups, arylalkylene groups, alkylarylene, alkylaryleneal-kylene groups, or a combination thereof. The first amine and second amine can also be cyclic amines, which can include one or more rings and can be aromatic or non-aromatic (e.g., saturated or unsaturated). One or more of the nitrogen atoms in the amine can be part of a carbon-nitrogen double bond. While in some embodiments, the first amine and second amine independently include only carbon-nitrogen, nitrogen-hydrogen, carbon-carbon, and carbon-hydrogen bonds, in other embodiments, the first amine and second amine can include other functional groups (e.g., hydroxyl or ether group). However, it is understood by a person skilled in the art that a compound including a nitrogen atom bonded to a carbonyl group is an amide, not an amine, and has different chemical properties from an amine. The first amine and second amine can include carbon atoms that are bonded to more than one nitrogen atom. Thus, the first amine and second amine can independently be a guanidine or amidine. As would be understood by a person skilled in the art, a lone pair of electrons on one or more nitrogens of the first amine and second amine distinguishes them from quaternary ammonium compounds, which have a permanent positive charge regardless of pH.

Examples of useful first and second amines include propylamine, butylamine, pentylamine, hexylamine, triethylamine, dimethylethanolamine, benzyldimethylamine, dimethylaniline, tribenzylamine, triphenylamine, tetramethylguanidine (TMG), 1,8-diazabicyclo[5.4.0]undec-7-ene (DBU), 1,5-diazabicyclo[4.3.0]non-5-ene (DBN), 1,4-diazabicyclo[2.2.2]octane (DABCO), quinuclidine, diphenylguanidine (DPG), dimethylaminomethyl phenol, and tris(dimethylaminomethyl)phenol. In some embodiments, the first amine and second amine are each independently a tertiary amine, an amidine, or a guanidine.

While the photolatent amine provides a cure-on-demand feature to a curable composition according the present disclosure when the curable composition is exposed to a light trigger, the presence of the second amine in the curable composition can provide advantages. The second amine provides the curable composition with a backup curing mechanism and ensures curing in cases in which photochemical irradiation is not an option, does not reach the entire composition (e.g., in unexposed areas), or is inadvertently omitted. As shown in Examples 9 and 10 and Comparative Example H, below, the second amine does not interfere with the photochemical cure using the composition according to the present disclosure, and the presence of the photolatent amine and photosensitizers does not interfere with the traditional cure provided by the second amine. See, Tables 3 and 7 in the Examples, below.

The second amine and its amount may be selected to provide the curable composition with a desirable amount of open time (that is, the length of time it takes for the composition to become at least partially gelled) after it is mixed or thawed. In some embodiments, the composition has an open time of at least 10 minutes, at least 30 minutes, at least one hour, or at least two hours. The amount of the second amine and its conjugate acid pKa both affect the open time. A composition with a smaller amount of a second amine having a higher pKa may have the same open time as a composition having a larger amount of a second amine having a lower pKa. For a second amine with a moderate conjugate acid pKa value in a range from about 7 to about 10, an amount of second amine in a range from 0.05 weight percent to about 10 weight percent (in some embodiments, 0.05 weight percent to 7.5 weight percent, or 1 weight percent to 5 weight percent) may be useful. For a second amine with a higher conjugate acid pKa value of about 11 or more, an amount of second amine in a range from 0.005 weight percent to about 3 weight percent (in some embodiments, 0.05 weight percent to about 2 weight percent) may be useful. These weight percentages are based on the total weight of the curable composition. In some embodiments in which the second amine is different from the first amine, the second amine has a lower conjugate acid pKa value than the first amine. This may be useful, for example, for achieving a desirable amount of open time and a desirably fast cure-on-demand. In some embodiments in which the second amine is different from the first amine, the first amine and the second amine have the same conjugate acid pKa value.

The curable composition disclosed herein that includes a second amine typically has a working time that can be useful for the production of very large structures, as is typical in the aircraft industry, and does not require heating above ambient conditions to cure. Thus, use of curable compositions as sealants may avoid unpredictable performance that may be associated with overheating either the sealant material, the structure to be sealed, or both.

While the first amine is photochemically generated from a photolatent amine, the first and second amines themselves are generally not considered photolatent amines That is, they do not undergo photochemical reactions that generate an amine by photocleavage, photoelimination, or another mechanism.

In some embodiments, including embodiments in which the curable compositions are used in sealant applications, for example, compositions according to the present disclosure can also contain fillers. Conventional inorganic fillers such as silica (e.g., fumed silica), calcium carbonate, aluminum silicate, and carbon black may be useful as well as low-density fillers. In some embodiments, the curable composition disclosed herein includes at least one of silica, hollow ceramic elements, hollow polymeric elements, calcium silicates, calcium carbonate, or carbon black. Silica, for example, can be of any desired size, including particles having an average size above 1 micrometer, between 100 nanometers and 1 micrometer, and below 100 nanometers. Silica can include nanosilica and amorphous fumed silica, for example. Suitable low density fillers may have a specific gravity ranging from about 1.0 to about 2.2 and are exemplified by calcium silicates, fumed silica, precipitated silica, and polyethylene. Examples include calcium silicate having a specific gravity of from 2.1 to 2.2 and a particle size of from 3 to 4 microns ("HUBERSORB HS-600", J. M. Huber Corp.) and fumed silica having a specific gravity of 1.7 to 1.8 with a particle size less than 1 ("CAB-O-SIL TS-720", Cabot Corp.). Other examples include precipitated silica having a specific gravity of from 2 to 2.1 ("HI-SIL TS-7000", PPG Industries), and polyethylene having a specific gravity of from 1 to 1.1 and a particle size of from 10 to 20 microns ("SHAMROCK S-395" Shamrock Technologies Inc.). The term "ceramic" refers to glasses, crystalline ceramics, glass-ceramics, and combinations thereof. Hollow ceramic elements can include hollow spheres and spheroids. The hollow ceramic elements and hollow polymeric elements may have one of a variety of useful sizes but typically have a maximum dimension of less than 500 micrometers, more typically less than 100 micrometers. The specific gravities of the microspheres range from about 0.1 to 0.7 and are exemplified by polystyrene foam, microspheres of polyacrylates and polyolefins, and silica microspheres having particle sizes ranging from 5 to 100 microns and a specific gravity of 0.25 ("ECCOSPHERES", W. R. Grace & Co.). Other examples include elastomeric particles available, for example, from Akzo Nobel, Amsterdam, The Netherlands, under the trade designation "EXPANCEL". Yet other examples include alumina/silica microspheres having particle sizes in the range of 5 to 300 microns and a specific gravity of 0.7 ("FILLITE", Pluess-Stauffer International), aluminum silicate microspheres having a specific gravity of from about 0.45 to about 0.7 ("Z-LIGHT"), and calcium carbonate-coated polyvinylidene copolymer microspheres having a specific gravity of 0.13 ("DUALITE 6001AE", Pierce & Stevens Corp.). Further examples of commercially available materials suitable for use as hollow, ceramic elements include glass bubbles marketed by 3M Company, Saint Paul, Minn., as "3M GLASS BUBBLES" in grades K1, K15, K20, K25, K37, K46, S15, S22, S32, S35, S38, S38HS, S38XHS, S42HS, S42XHS, S60, S60HS, iM30K, iM16K, XLD3000, XLD6000, and G-65, and any of the HGS series of "3M GLASS BUBBLES"; glass bubbles marketed by Potters Industries, Carlstadt, N.J., under the trade designations "Q-CEL HOLLOW SPHERES" (e.g., grades 30, 6014, 6019, 6028, 6036, 6042, 6048, 5019, 5023, and 5028); and hollow glass particles marketed by Silbrico Corp., Hodgkins, Ill. under the trade designation "SIL-CELL" (e.g., grades SIL 35/34, SIL-32, SIL-42, and SIL-43). Such fillers, alone or in combination, can be present in a sealant in a range from 10 percent by weight to 55 percent by weight, in some embodiments, 20 percent by weight to 50 percent by weight, based on the total weight of the sealant composition.

Curable compositions disclosed herein including those used in sealant applications, for example, can also contain at least one of cure accelerators, surfactants, adhesion promoters, thixotropic agents, antioxidants, radical inhibitors (e.g., hindered phenols and radical traps such as 2,2,6,6-tetramethyl-1-piperidinyloxy), colorants (e.g., pigments and dyes), UV stabilizers, and solvents. The solvent can conveniently be any material (e.g., N-methyl-2-pyrrolidone, tetrahydrofuran, ethyl acetate, or those described below) capable of dissolving the photolatent amine or another component of the composition.

In some embodiments, curable compositions disclosed herein include at least one oxidizing agent. Oxidizing agents can be useful, for example, when the curable composition includes a polysulfide oligomer or polymer. In these compositions, oxidizing agents can minimize the degradation or interchanging of disulfide bonds in the sealant network. Useful oxidizing agents include a variety of organic and inorganic oxidizing agents (e.g., organic peroxides and metal oxides). Examples of metal oxides useful as oxidizing agents include calcium dioxide, manganese dioxide, zinc dioxide, lead dioxide, lithium peroxide, and sodium perborate hydrate. Other useful inorganic oxidizing agents include sodium dichromate. Examples of organic peroxides useful as oxidizing agents include hydroperoxides (e.g., cumene, tert-butyl or tert-amyl hydroperoxide), dialkyl peroxides (e.g., di-tert-butylperoxide, dicumylperoxide, or cyclohexyl peroxide), peroxyesters (e.g., tert-butyl perbenzoate, tert-butyl peroxy-2-ethylhexanoate, tert-butyl peroxy-3,5,5-trimethylhexanoate, tert-butyl monoperoxymaleate, or di-tert-butyl peroxyphthalate), peroxycarbonates (e.g., tert-butylperoxy 2-ethylhexylcarbonate, tert-butylperoxy isopropyl carbonate, or di(4-tert-butylcyclohexyl) peroxydicarbonate), ketone peroxides (e.g., methyl ethyl ketone peroxide, 1,1-di(tert-butylperoxy)cyclohexane, 1,1-di(tert-butylperoxy)-3,3,5-trimethylcyclohexane, and cyclohexanone peroxide), and diacylperoxides (e.g., benzoyl peroxide or lauryl peroxide). Other useful organic oxidizing agents include para-quinone dioxime.

Polymerizable compositions according to the present disclosure can be made by combining polymerizable material and a photolatent amine, camphorquinone, and a coumarin sensitizer. In some embodiments, curable compositions can be made by combining a polythiol comprising more than one thiol groups, a polyepoxide comprising more than one epoxide group, photolatent amine, camphorquinone, and a coumarin sensitizer. The polythiol, polyepoxide, photolatent amine, and coumarin sensitizer can be those as described above in any of their embodiments. The polythiol, polyepoxide, photolatent amine, camphorquinone, and a coumarin sensitizer, and any other components described in any of the above embodiments may be provided as a one-part composition. To make a one-part composition, the components may be added in any convenient order. It may be useful to store such a composition frozen and away from light before it is applied (e.g., as a sealant) and cured. Frozen storage can be useful, for example, when the curable composition includes a second amine. The composition may also arise from combining components of a two-part system. For example, a first component comprising the polyepoxide can conveniently be combined with a second component comprising the polythiol, photolatent amine, camphorquinone, a coumarin sensitizer, and optionally a second amine to generate a curable composition according to the present disclosure. In another example, a first component may comprise the polyepoxide and the photolatent amine, camphorquinone, and a coumarin sensitizer, and a second component may comprise the polythiol and a catalytic amount of second amine Other combinations may also be useful.

In some embodiments, curable compositions according to the present disclosure can be made by providing a starting composition comprising the curable material (in some embodiments, the polythiol comprising more than one thiol group, the polyepoxide comprising more than one epoxide group) and optionally a catalytic amount of the second amine. The starting composition may be stored frozen as a one-part composition or stored as a two-part composition and mixed shortly before use. The starting composition may, in some embodiments, be applied to a substrate to be coated or sealed, for example, leaving a surface of the starting composition exposed. A solution comprising the photolatent amine, camphorquinone, and a coumarin sensitizer can then be applied to the surface of the starting composition. The solution comprising the photolatent amine, camphorquinone, and a coumarin sensitizer can be applied by any convenient method, for example, dip coating, knife coating, reverse roll coating, brushing, and spraying (e.g., aerosol spraying or electrostatic spraying). The solution may be allowed to penetrate into the starting composition for any desired length of time to allow the photolatent amine to combine with the curable material and optionally the second amine. Following the application of the solution comprising the photolatent amine, camphorquinone, and a coumarin sensitizer to the surface of the starting composition, at least a non-tacky skin can be made on the surface by exposing the applied photolatent amine to an appropriate light source. The non-tacky skin can advantageously serve to protect the underlying composition while it continues to cure (e.g., by means of the first amine or second amine).

In these embodiments, the solution including the photolatent amine, camphorquinone, and a coumarin sensitizer can include any suitable solvent or solvents capable of dissolving these components. The components may be present in the solvent at any suitable concentration, (e.g., from about 5 percent to about 90 percent by weight based on the total weight of the solution). Illustrative examples of suitable solvents include aliphatic and alicyclic hydrocarbons (e.g., hexane, heptane, and cyclohexane), aromatic solvents (e.g., benzene, toluene, and xylene), ethers (e.g., diethyl ether, glyme, diglyme, and diisopropyl ether), esters (e.g., ethyl acetate and butyl acetate), alcohols (e.g., ethanol and isopropyl alcohol), ketones (e.g., acetone, methyl ethyl ketone, and methyl isobutyl ketone), sulfoxides (e.g., dimethyl sulfoxide), amides (e.g., N,N-dimethylformamide and N,N-dimethylacetamide), halogenated solvents (e.g., methylchloroform, 1,1,2-trichloro-1,2,2-trifluoroethane, trichloroethylene, and trifluorotoluene), and mixtures thereof.

The method of making a polymer network includes exposing the composition disclosed herein in any of its embodiments to light having a wavelength in a range from 400 nm to 510 nm to generate the first amine to at least partially cure the composition. In some embodiments, the wavelength of light is in a range from 400 nm to 500 nm. In some embodiments, the light is blue light. In some embodiments, the wavelength of the light is in a range from 450 to 495.

The use of visible light is considered a safer alternative to UV light. In particular, UV light has the potential to damage the eyes and skin, and the light sources can generate ozone. In coating lines and automated assembly lines these drawbacks can be mitigated by engineering controls such as shielding and ventilation systems. However, in some industries and for some applications the implementation of these engineering controls is impractical, if not impossible. Examples include the assembly of large structures, such as encountered in the aerospace, commercial transportation, ship building, and construction industries, and the assembly or repair of devices or objects that are custom or varied, such as those encountered in automobile repair, appliance repair, home and property repair, and dental and medical procedures.

Examples of useful light sources include photographic flood lamps, quartz-tungsten-halogen lamps, light-emitting diodes, laser light sources (for example, excimer lasers); and combinations thereof. The relatively recent progress in the development of light emitting diodes (LED's) has made available light sources with narrow wavelength range capable of high intensity in the visible range. These LED's do not generate ozone, and allow the fabrication of light sources or lamps with customized form factors that are lightweight, which is an important feature for handheld lamps. The distance between the light source and the coated substrate can vary widely, depending upon the particular application and the type and/or power of the light source. For example, distances up to about 150 cm, distances from about 0.01 cm to 150 cm, or a distance as close as possible without touching the composition can be useful. Through the use of blue light, curable compositions disclosed herein may be cured to large cure depths and may be cured in the presence of filler.

Depending on various factors, exposure to light might be sufficient to cure the composition to the desired non-tackiness and hardness. In some cases, the first amine that is generated from the photolatent amine remains active in the composition, and the composition continues to react or cure after the light is removed. However, the thickness of the composition, the presence and nature of filler, the existence and size of areas shielded from light, and other factors may prevent the curing of the composition to the desired non-tackiness and hardness. For some applications, exposure to light may not be possible or may be inadvertently omitted after applying the composition to a substrate. In some of these embodiments, a second amine may be present in the composition, and the method of making a polymer network can include allowing the composition to achieve a temperature sufficient for the second amine to at least partially cure the composition. In some embodiments, the temperature sufficient for the second amine to at least partially cure the composition is ambient temperature (that is, no external heat source is necessary). In these embodiments, a catalytic amount of the second amine serves as a useful backup cure mechanism for the composition.

For any of the embodiments of the methods according to the present disclosure, exposing the composition to light at least partially cures the composition. In some of these embodiments, at least the surface of the composition is cured to an extent that the surface becomes non-tacky. A non-tacky surface may be one in which the surface no longer tightly adheres to L-LP-690 standard low density polyethylene film as determined using ASTM C679. A non-tacky surface may also be one that is FOD-free according to the following evaluation. After curing, fine aluminum shavings can be spread on to the cured sealant surface and allowed to remain undisturbed for 30 seconds at 70° F. (21.1° C.). The sealant can then be inverted to allow the shavings to fall off, after which the sealant surface can be gently brushed using a fine fiber paintbrush to remove any remaining aluminum shavings. The surface can be considered FOD-free, akin to non-tacky, if no aluminum shavings remain on the surface after inversion and/or after brushing. Such a non-tacky surface may be achieved after exposure of the composition disclosed herein to a light source for up to 10 minutes, up to 5 minutes, up to 3 minutes, up to 2 minutes, or, in some cases, up to 1 minute or up to 30 seconds. Without exposure to light, in some embodiments, curable compositions according to the present disclosure that include a second amine exhibits at least one of a non-tacky surface or a 30 Shore "A" hardness in less than 24 hours, in some embodiments, less than 12 hours or 10 hours under ambient conditions. With or without exposure to light, in some embodiments, the compositions according to the present disclosure can achieve a 45 to 50 Shore "A" hardness in up to 2 weeks, up to 1 week, up to 5 days, up to 3 days, or up to 1 day.

Polymer networks prepared as described above in any of their embodiments are useful for a variety of applications. For example, polymer networks prepared from polythiols and polyepoxies can be useful as sealants, for example, aviation fuel resistant sealants. Aviation fuel resistant sealants are widely used by the aircraft industry for many purposes. Commercial and military aircraft are typically built by connecting a number of structural members, such as longitudinal stringers and circular frames. The aircraft skin, whether metal or composite, is attached to the outside of the stringers using a variety of fasteners and adhesives. These structures often include gaps along the seams, joints between the rigidly interconnected components, and overlapping portions of the exterior aircraft skin. A curable composition according to the present disclosure can be useful, for example, for sealing such seams, joints, and overlapping portions of the aircraft skin. The curable composition may be applied, for example, to aircraft fasteners, windows, access panels, and fuselage protrusions. As a sealant, the composition disclosed herein may prevent the ingress of weather and may provide a smooth transition between the outer surfaces to achieve desired aerodynamic properties. The composition according to the present disclosure may likewise be applied to interior assembles to prevent corrosion, to contain the various fluids and fuels necessary to the operation of an aircraft, and to allow the interior of the aircraft (e.g., the passenger cabin) to maintain pressurization at higher altitudes. Among these uses are the sealing of integral fuel tanks and cavities.

Aircraft exterior and interior surfaces, to which sealants may be applied, may include metals such as titanium, stainless steel, and aluminum, and/or composites, any of which may be anodized, primed, organic-coated or chromate-coated. For example, a dilute solution of one or more phenolic resins, organo-functional silanes, titanates or zirconates, and a surfactant or wetting agent dissolved in organic solvent or water may be applied to an exterior or interior surface and dried.

Existing sealant products now in use in the aircraft industry are typically either two-part products or one-part products. For the two-part products, once the user mixes the two parts, the reaction begins and the sealant starts to form into an elastomeric solid. After mixing, the time that the sealant remains usable is called the application life or open time. Throughout the application life, viscosity of the sealant gradually increases until the sealant is too viscous to be applied. Application life and cure time are typically related in that short-application-life products cure quickly. Conversely, long-application-life products cure slowly. In practice, customers chose products with differing application lives and cure times depending on the specific application. This requires the customer to maintain inventories of multiple products to address the production flow requirements of building and repairing aircraft. For one-part products, users can avoid a complicated mixing step, but the product has to be shipped and stored in a freezer before application. Advantageously, in many embodiments, curable compositions disclosed herein can be useful as one-part sealants that can simultaneously have a long application life but can be cured on demand.

Sealants may optionally be used in combination with a seal cap, for example, over rivets, bolts, or other types of fasteners. A seal cap may be made using a seal cap mold, filled with a curable sealant, and placed over a fastener. The curable sealant may then be cured. In some embodiments, the seal cap and the curable sealant may be made from the same material. In some embodiments, the seal cap may be made from a curable composition disclosed herein. For more details regarding seal caps, see, for example, Int. Pat. App. Pub. No. W02014/172305 (Zook et al.).

In some embodiments, curable compositions disclosed herein may be useful in these applications, for example, because of their fuel resistance and low glass transition temperatures. In some embodiments, the polymer network according to the present disclosure has a low glass transition temperature, in some embodiments less than −20° C., in some embodiments less than −30° C., in some embodiments less than −40° C., and in some embodiments less than −50° C. In some embodiment, the polymer network according to the present disclosure has high jet fuel resistance, characterized by a volume swell of less than 30% and a weight gain of less than 20% when measured according to Society of Automotive Engineers (SAE) International Standard AS5127/1.

Some Embodiments of the Disclosure

In a first embodiment, the present disclosure provides a composition comprising a photolatent amine, camphorquinone, and a coumarin sensitizer, wherein the coumarin sensitizer is triplet photosensitizer and has an absorbance with a wavelength of maximum absorbance in a range from 390 nanometers to 510 nanometers.

In a second embodiment, the present disclosure provides the composition of the first embodiment, wherein the coumarin sensitizer comprises at least one of 3,3'-carbonylbis (5,7-dimethoxycoumarin), 3-benzoyl-7-diethylaminocoumarin, 7-diethylamino-3-thenoylcoumarin, 3-(2-benzofuroyl)-7-diethylaminocoumarin, 7-diethylamino-5', 7'-dimethoxy-3,3'-carbonylbiscoumarin, 3,3'-carbonylbis(7-diethylaminocoumarin), 9-(7-diethylamino-3-coumarinoyl)-1,2,4,5-tetrahydro-3H,6H,10H[1]benzopyrano[9,9a,1-gh]quinolazine-10-one, and 9,9'-carbonylbis(1,2,4,5-tetrahydro-3H,6H,10H [1]benzopyrano [9,9a,1-gh]quinolazine-10-one).

In a third embodiment, the present disclosure provides the composition of the first or second embodiment, wherein the coumarin sensitizer comprises at least one of 3,3'-carbonylbis(7-diethylaminocoumarin), 7-diethylamino-3-thenoylcoumarin, 3-(2-benzofuroyl)-7-diethylaminocoumarin, and 9,9'-carbonylbis(1,2,4,5-tetrahydro-3H,6H,10H[1]benzopyrano[9,9a,1-gh]quinolazine-10-one).

In a fourth embodiment, the present disclosure provides the composition of any one of the first to third embodiments, wherein the coumarin sensitizer comprises at least one of 3,3'-carbonylbis(7-diethylaminocoumarin) or 7-diethylamino-3-thenoylcoumarin.

In a fifth embodiment, the present disclosure provides the composition of any one of the first to fourth embodiments, wherein the photolatent amine is represented by formula:

wherein $R_1$ is selected from phenyl, naphthyl, phenanthryl, anthracenyl, pyrenyl, 5,6,7,8-tetrahydro-2-naphthyl, 5,6,7,8-tetrahydro-1-naphthyl, thienyl, benzo[b]thienyl, naphtho[2,3-b]thienyl, thianthrenyl, anthraquinonyl, dibenzofuryl, chromenyl, xanthenyl, thioxanthyl, phenoxathiinyl, pyrrolyl, imidazolyl, pyrazolyl, pyrazinyl, pyrimidinyl, pyridazinyl, indolizinyl, isoindolyl, indolyl, indazolyl, purinyl, quinolizinyl, isoquinolyl, quinolyl, phthalazinyl, naphthyridinyl, quinoxalinyl, quinazolinyl, cinnolinyl, pteridinyl, carbazolyl, β-carbolinyl, phenanthridinyl, acridinyl, perimidinyl, phenanthrolinyl, phenazinyl, isothiazolyl, phenothiazinyl, isoxazolyl, furazanyl, terphenyl, stilbenyl, fluorenyl, phenoxazinyl, and combinations thereof, wherein any of these are unsubstituted or substituted by one or more alkyl, alkenyl, alkynyl, haloalkyl, —$NO_2$, —$NR_{10}R_{11}$, —CN, —$OR_{12}$, —$SR_{12}$, —$C(O)R_{13}$, —$C(O)OR_{14}$, or halogen groups, a radical of the formula $N(R_7)(R_6)$—$CH(R_5)$—$N(R_4)$—$C(R_2)(R_3)$—, or a combination thereof;

$R_2$ and $R_3$ each are independently selected from hydrogen, alkyl, or phenyl that is unsubstituted or is substituted by one or more times by alkyl, CN, —$OR_{12}$, —$SR_{12}$, halogen, or haloalkyl;

$R_5$ is alkyl or —$NR_8R_9$;

$R_4$, $R_6$, $R_7$, $R_8$, $R_9$, $R_{10}$, $R_{11}$, $R_{12}$, $R_{13}$, and $R_{14}$ are each independently hydrogen or alkyl; or $R_4$ and $R_6$ together form a $C_2$-$C_6$ alkylene bridge that is unsubstituted or substituted by one or more alkyl groups having up to four carbon atoms; or $R_5$ and $R_7$, independently of $R_4$ and $R_6$, together form a $C_2$-$C_6$ alkylene bridge that is unsubstituted or is substituted by one or more alkyl groups having up to four carbon atoms; or if $R_5$ is —$NR_8R_9$, $R_7$ and $R_9$ together form a $C_2$-$C_6$ alkylene bridge that is unsubstituted or substituted by one or more alkyl groups having up to four carbon atoms.

In a sixth embodiment, the present disclosure provides the composition of any one of the first to fifth embodiments, wherein the photolatent amine comprises at least one compound represented by formula

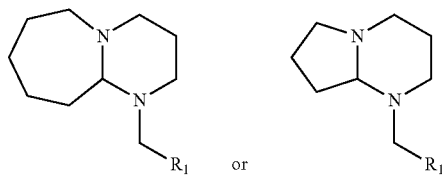

wherein $R_1$ is phenyl, naphthyl, or anthracenyl, each of which is unsubstituted or substituted by at least one substituent selected from the group consisting of methyl, cyano, nitro, ethenyl, or chloro, and wherein the photolatent amine photochemically generates 1,8-diazabicyclo[5.4.0]undec-7-ene (DBU) or 1,5-diazabicyclo[4.3.0]non-5-ene (DBN).

In a seventh embodiment, the present disclosure provides the composition of any one of the first to sixth embodiments, wherein a weight ratio of photolatent amine to a combined weight of camphorquinone and the coumarin sensitizer is in a range from 1:1 to 5:1.

In an eighth embodiment, the present disclosure provides the composition of any one of the first to seventh embodiments, wherein a weight ratio of camphorquinone to the coumarin sensitizer is in range from 1:1 to 10:1.

In a ninth embodiment, the present disclosure provides the composition of any one of the first to eighth embodiments, further comprising at least one polymerizable material.

In a tenth embodiment, the present disclosure provides the composition of any one of the first to eighth embodiments, further comprising a polythiol comprising more than one thiol group, a polyepoxide comprising more than one epoxide group.

In an eleventh embodiment, the present disclosure provides the composition of the tenth embodiment, wherein the polythiol is monomeric.

In a twelfth embodiment, the present disclosure provides the composition of the tenth embodiment, wherein the polythiol is oligomeric or polymeric.

In a thirteenth embodiment, the present disclosure provides the composition of the twelfth embodiment, wherein the polythiol is a poly sulfide oligomer or polymer.

In a fourteenth embodiment, the present disclosure provides the composition of the thirteenth embodiment, further comprising an oxidizing agent.

In a fifteenth embodiment, the present disclosure provides the composition of the fourteenth embodiment, wherein the oxidizing agent comprises at least one of calcium dioxide, manganese dioxide, zinc dioxide, lead dioxide, lithium peroxide, sodium perborate hydrate, sodium dichromate, or an organic peroxide.

In a sixteenth embodiment, the present disclosure provides the composition of the twelfth embodiment, wherein the polythiol is a polythioether.

In a seventeenth embodiment, the present disclosure provides the composition of the sixteenth embodiment, wherein the polythiol is an oligomer or polymer prepared from components comprising a dithiol and a diene or divinyl ether.

In an eighteenth embodiment, the present disclosure provides the composition of any one of the tenth to seventeenth embodiments, wherein the polyepoxide is monomeric.

In a nineteenth embodiment, the present disclosure provides the composition of any one of the tenth to seventeenth embodiments, wherein the polyepoxide is oligomeric or polymeric.

In a twentieth embodiment, the present disclosure provides the composition of any one of the tenth to nineteenth embodiments, wherein the polyepoxide is aromatic.

In a twenty-first embodiment, the present disclosure provides the composition of any one of the tenth to nineteenth embodiments, wherein the polyepoxide is non-aromatic.

In a twenty-second embodiment, the present disclosure provides the composition of any one of the tenth to twenty-first embodiments, wherein the polyepoxide comprises three or more epoxide groups.

In a twenty-third embodiment, the present disclosure provides the composition of any one of the ninth to twenty-second embodiments, further comprising filler.

In a twenty-fourth embodiment, the present disclosure provides the composition of the twenty-third embodiment, wherein the filler comprises at least one of silica, carbon black, calcium carbonate, aluminum silicate, or lightweight particles having a density of up to 0.7 grams per cubic centimeter.

In a twenty-fifth embodiment, the present disclosure provides the composition of any one of the ninth to twenty-fourth embodiments, further comprising a second amine.

In a twenty-sixth embodiment, the present disclosure provides the composition of the twenty-fifth embodiment, wherein the second amine comprises at least one of triethylamine, dimethylethanolamine, benzyldimethylamine, dimethylaniline, tribenzylamine, triphenylamine, tetramethylguanidine (TMG), 1,8-diazabicyclo[5.4.0]undec-7-ene (DBU), 1,5-diazabicyclo[4.3.0]non-5-ene (DBN), 1,4-diazabicyclo[2.2.2]octane (DABCO), quinuclidine, diphenylguanidine (DPG), dimethylaminomethyl phenol, and tris(dimethylaminomethyl)phenol.

In a twenty-seventh embodiment, the present disclosure provides the composition of the twenty-fifth or twenty-sixth embodiment, wherein the second amine comprises 1,4-diazabicyclo[2.2.2]octane.

In a twenty-eighth embodiment, the present disclosure provides the composition of any one of the twenty-fifth to twenty-seventh embodiments, wherein the composition has an open time of at least ten minutes.

In a twenty-ninth embodiment, the present disclosure provides a polymer network preparable from the composition of any one of the tenth to twenty-sixth embodiments, wherein at least some of the thiol groups and epoxide groups have reacted to form thioether groups and hydroxyl groups.

In a thirtieth embodiment, the present disclosure provides a sealant comprising the polymer network of the twenty-ninth embodiment.

In a thirty-first embodiment, the present disclosure provides the sealant of the thirtieth embodiment disposed on an aircraft.

In a thirty-second embodiment, the present disclosure provides a method of making a polymer network, the method comprising exposing the composition of any one of the ninth to twenty-eighth embodiments to light having a wavelength in a range from 400 nanometers to 510 nanometers to at least partially cure the composition.

In a thirty-third embodiment, the present disclosure provides a method of making a polymer network, the method comprising:
combining the composition of any one of the first to eighth embodiments with a curable material; and
exposing the curable material to light having a wavelength in a range from 400 nanometers to 510 nanometers to at least partially cure the curable material.

In a thirty-fourth embodiment, the present disclosure provides the method of the thirty-third embodiment, wherein combining the composition with the curable material comprises applying a solution comprising the photolatent amine to a surface of the starting composition.

In a thirty-fifth embodiment, the present disclosure provides the method of the thirty-fourth embodiment, further comprising allowing the solution to penetrate into the starting composition.

In a thirty-sixth embodiment, the present disclosure provides the method of the thirty-fourth or thirty-fifth embodiment, wherein applying comprises spraying the solution.

In a thirty-seventh embodiment, the present disclosure provides the method of the thirty-third embodiments, wherein combining the composition with the curable material comprises mixing the composition with the curable material.

In a thirty-eighth embodiment, the present disclosure provides the method of any one of the thirty-second to thirty-seventh embodiments, wherein exposing the composition to light to at least partially cure the composition comprises forming at least a non-tacky surface.

In a thirty-ninth embodiment, the present disclosure provides the method of any one of the thirty-second to thirty-eighth embodiments, wherein exposing the composition to light to at least partially cure the composition comprises at least partially gelling the composition.

In a fortieth embodiment, the present disclosure provides the method of any one of the thirty-second to thirty-ninth embodiments, wherein exposing the composition to light to at least partially cure the composition comprises fully curing the composition.

In order that this disclosure can be more fully understood, the following examples are set forth. It should be understood that these examples are for illustrative purposes only, and are not to be construed as limiting this disclosure in any manner.

EXAMPLES

Unless otherwise noted, all reagents were obtained or are available from Sigma-Aldrich Company, St. Louis, Mo., or may be synthesized by known methods. Unless otherwise reported, all ratios are by weight percent.
The following abbreviations are used to describe the examples:
° C.: degrees Centigrade
° F.: degrees Fahrenheit
cm: centimeter
LED: light emitting diode
mL: milliliter
min.: minute
mm: millimeter
mmol: millimole
MW: molecular weight
mW/cm$^2$: milliwatts per square centimeter
nm: nanometer
NMR: nuclear magnetic resonance
rpm: revolutions per minute
Abbreviations for the materials used in the examples are as follows:
AC-1: A thiol terminated polythioether oligomer with approximately 3200 MW and the thiol equivalent weight of 1454, synthesized as described below.
CGI-90: A photolatent amine obtained from BASF, Ludwigshafen, Germany.
CMP: 3-chloro-2-methyl-1-propene, obtained from Sigma-Aldriich Company.
CMP Diene: 4,13-dithia-7,10-dioxa-2,15-dimethylhexadecyl-1,15-diene, synthesized as described below.
Coumarin 314: Coumarin 314 obtained from Sigma-Aldrich Company.
CPQ: Camphorquinone, a photosensitizer obtained from Sigma-Aldrich Company.
DABCO: 1,4-Diazabicyclo[2.2.2]octane, obtained under the trade designation "DABCO CRYSTALLINE" from Air Products & Chemicals, Inc., Allentown, Pa.
DABCO33: A 33% by weight solution of DABCO in dipropylene glycol, obtained under the trade designation "DABCO 33-LV" from Air Products & Chemicals, Inc.
DMDO: 1,8-Dimercapto-3,6-dioxaoctane, obtained from Arkema, Inc., King of Prussia, Pa.
DVE-3: Triethyleneglycol divinylether, from BASF Corp.

E-8220: A diglycidylether of bisphenol F, obtained under the trade designation "EPALLOY 8220" from Emerald Performance Materials, LLC, Cuyahoga Falls, Ohio EPON-862: Diglycidyl ether of bisphenol F low viscosity epoxy resin with an approximate epoxy equivalent weight of between 165-173 grams/equivalent, obtained under the trade designation "EPON-862" from Hexion Specialty Chemicals, Houston, Tex.

EX-214L: 1,4-Butanediol diglycidyl ether, obtained under the trade designation "DENACOL EX-214L" from Nagase America Corporation, New York, N.Y.

GE30: Trimethylolpropane triglycidylether, obtained under the trade designation "ERISYS GE-30" from Emerald Performance Materials Company.

ITX: Isopropylthioxanthone (Isopropyl-9H-thioxanthen-9-one) obtained from Sigma-Aldrich Company.

KC-1: 3,3'-Carbonylbis(7-diethylaminocoumarin) obtained from Acros Organics, which is part of Thermo Fisher Scientific, Waltham, Mass.

KC-2: 7-diethylamino-3-thenoylcoumarin obtained from Exciton, Inc., Dayton, Ohio.

LP33: A liquid poly sulfide polymer with thiol functionality, obtained under the trade designation "THIOKOL LP-33" from Toray Fine Chemicals Co., Ltd., Urayasu, Japan.

TVCH: 1,2,4-Trivinylcyclohexane, obtained from BASF Corp., Florham Park, N.J.

VAZO-52: 2,2'-azobis(2,4-dimethyl-pentanenitrile), obtained under the trade designation "VAZO 52" from E.I. du Pont de Nemours and Company, Wilmington, Del.

AC-1 Synthesis

Into a 100-ml round bottom flask equipped with an air-driven stirrer, thermometer, and a dropping funnel, was added 39.64 grams (0.22 mole) DMDO and 4.10 grams (0.0125 mole) E-8220; 0.02 gram DABCO was mixed in as a catalyst. The system was flushed with nitrogen, then mixed and heated for 1.5 hours at 60-70° C. 3.66 grams (0.0125 mole) CMP Diene was added along with approximate 0.01 gram Vazo-52. The material is mixed and heated at approximately 60° C. for 1.5 hrs. 0.83 grams (0.005 mole) TVCH was added and heating continued for another 1.5 hours. 31.80 grams (0.157 moles) DVE-3 was then added dropwise to the flask over 45-60 minutes, keeping the temperature at approximately 70° C. Vazo-52 was added in approximately 0.01 gram units over approximately 16 hours for a total of about 0.4 grams. The temperature was raised to 100° C. and the material degassed for approximately 10 minutes. The resultant polythioether was approximately 3200 MW with a thiol equivalent weight of 1454 and 2.2 functionality.

CMP Diene Synthesis

Into a 500 mL four-neck, round bottom flask fitted with a stirrer, thermometer, chilled water condenser and a pressure equalizing addition funnel was added 206.54 grams of a 20% aqueous solution of sodium hydroxide (1.033 moles). To this was added, drop wise with stirring, 94.08 grams (0.51 moles) DMDO, and the mixture then allowed to cool to approximately 21° C. 96.4 grams (1.065 moles) CMP was added drop wise with vigorous stirring, and stirring continued for another 2 hours. The mixture was then held at 21° C. for approximately 16 hours, after which 150 grams of a clear layer was decanted. NMR analysis confirmed the decanted layer to be CMP Diene.

Comparative Example A (CE-A)

CGI-90 (0.1252 grams), ITX (0.1481 grams), EX-214L (0.2387 grams), GE-30 (0.2761 grams), and LP-33 (2.2640 grams) were added to a Max 10 opaque white plastic mixing cup, obtained from FlackTek Inc., Landrum, S.C. The composition was mixed for two minutes, in one minute intervals, at 21° C. and 3,000 rpm, using a centrifugal mixer, Speed-Mixer model "DAC 150.1 FVZ-K" from FlackTek, Inc. The composition was allowed to stand in the sealed cup for approximately 2 hours, and then mixed again for two minutes until homogeneous, in one minute intervals, at 21° C. and 3,000 rpm. As described herein, all other examples, comparatives and master batches were mixed until homogeneous at the final mixing stage.

Comparative Example B (CE-B)

CGI-90 (0.2183 grams), EX-214L (0.4373 grams), GE-30 (0.4753 grams), and LP-33 (3.8900 grams) were added to a Max 10 opaque white plastic mixing cup. The composition was mixed for two minutes, in one minute intervals, at 21° C. and 3,000 rpm using the centrifugal mixer. The composition was allowed to stand in the sealed mixing cup for 45 minutes at 21° C., then mixed again for two minutes, in one minute intervals at 3,000 rpm. 1.0150 grams of this composition and 0.0168 grams CPQ were added to a new Max 10 mixing cup and mixed for two minutes, in one minute intervals, at 3,000 rpm. The composition was allowed to stand in the sealed mixing cup for 1 hour at 21° C., then mixed again for two minutes, in one minute intervals at 3,000 rpm.

Comparative Example C (CE-C)

CGI-90 (0.2177 grams), EX-214L (0.4148 grams), GE-30 (0.4787 grams), and LP-33 (3.8817 grams) were added to a Max 10 opaque white plastic mixing cup. The composition was mixed for two minutes, in one minute intervals, at 21° C. and 3000 rpm using the centrifugal mixer. The composition was allowed to stand in the sealed mixing cup for 45 minutes at 21° C., then mixed again for two minutes, in one minute intervals at 3000 rpm. 1.0040 grams of this composition and 0.0462 grams KC-1 were added to a new Max 10 mixing cup and mixed for two minutes, in one minute intervals, at 3000 rpm using the centrifugal mixer. The composition was allowed to stand in the sealed mixing cup for 1 hour at 21° C., then mixed again for two minutes, in one minute intervals at 3000 rpm. The composition was allowed to stand in the sealed mixing cup for an additional 40 minutes at 21° C., then mixed again for two minutes, in one minute intervals at 3000 rpm.

Comparative Example D (CE-D)

A master batch, MB-1, of CGI-90 (0.3048 grams), EX-214L (0.5803 grams), GE-30 (0.6848 grams), and LP-33 (5.4442 grams) was prepared by adding the components to a Max 10 opaque white plastic mixing cup, and mixing for two minutes, in one minute intervals, at 21 C and 3000 rpm using the centrifugal mixer. Then the composition was allowed to stand in the sealed mixing cup for 45 minutes at 21° C., then mixed again for two minutes, in one minute intervals at 3000 rpm. 1.0090 grams MB-1 and 0.0333 grams CPQ were added to a new Max 10 mixing cup and homogenized for two minutes, in one minute intervals, at 21° C. and 3,000 rpm using the centrifugal mixer. The composition was allowed to stand in the sealed mixing cup for 1 hour at 21° C., then mixed again for two minutes, in one minute intervals at 3,000 rpm. The composition was allowed to stand in the sealed mixing cup for an additional 40 minutes at 21° C., then mixed again for two minutes, in one minute intervals at 3,000 rpm.

Comparative Example E and Examples 1-4 (CE-E; EX-1 Through EX-4)

The procedure generally described for preparing Comparative Example D was repeated, according to the compositions listed in Table 1, where MB-1 from Comparative Example D was utilized and KC-1 or both CPQ and KC-1 replaced solely CPQ in the preparation.

TABLE 1

| Example | Composition (grams) | | |
|---|---|---|---|
| | MB-1 | CPQ | KC-1 |
| CE-D | 1.0090 | 0.0333 | 0 |
| CE-E | 1.0090 | 0 | 0.0127 |
| EX-1 | 1.0024 | 0.0332 | 0.0126 |
| EX-2 | 1.0153 | 0.0332 | 0.0057 |
| EX-3 | 1.0030 | 0.0165 | 0.0123 |
| EX-4 | 0.9991 | 0.0167 | 0.0057 |

Comparative Examples F-G and Examples 5-8 (CE-F Through CE-G; EX-4 Through EX-8)

A master batch, MB2, was prepared as generally described for preparing MB1, according to the following composition: CGI-90 (0.3053 grams), EX-214L (0.5852 grams), GE-30 (0.6846 grams), and LP-33 (5.4295 grams). Comparatives Examples CE-F and CE-G, and Examples of the present invention, EX-5 through EX-8, were prepared as generally described in CE-D and EX-1, according to the compositions listed in Table 2.

TABLE 2

| Example | Composition (grams) | | |
|---|---|---|---|
| | MB-2 | CPQ | KC-2 |
| CE-F | 0.9912 | 0.0334 | 0 |
| CE-G | 1.0197 | 0 | 0.0127 |
| EX-5 | 1.0086 | 0.0337 | 0.0125 |
| EX-6 | 1.0172 | 0.0335 | 0.0058 |
| EX-7 | 1.0124 | 0.0167 | 0.0122 |
| EX-8 | 0.9935 | 0.0167 | 0.0059 |

Comparative Example H and Examples 9-10 (CE-H; EX-9 Through EX-10)

A master batch, MB3, was prepared as generally described for preparing MB1, according to the following composition: CGI-90 (0.1305 grams), EX-214L (0.2759 grams), GE-30 (0.2943 grams), and LP-33 (2.3187 grams). CE-H was made by adding DABCO33 (0.0069 g) and MB-3 (0.7464 g) to a new Max 10 mixing cup, and mixing for 1 min at 21° C. and 3000 rpm using the centrifugal mixer. EX-9 was made by adding KC-1 (0.0123 g), CPQ (0.0670 g), and MB-3 (1.9996 g) to a new Max 10 mixing cup and mixing for two minutes, in one minute intervals, at 21° C. and 3000 rpm using the centrifugal mixer. The composition was allowed to stand in the sealed mixing cup for 1 hour at 21° C., then mixed again for two minutes, in one minute intervals at 3000 rpm. The composition was allowed to stand in the sealed mixing cup for an additional 40 minutes at 21° C., then mixed again for two minutes, in one minute intervals at 3000 rpm. E-10 was made by adding DABCO33 (0.0103 g) and EX-9 (0.9943 g) to a new Max 10 mixing cup, and mixing one time at 21° C. and 3000 rpm for 1 min. Compositions of CE-H, EX-9, and EX-10 are listed in Table 3. After mixing, the compositions were held in the sealed cups at 21° C., and the cups periodically opened and inspected for gelling after 65, 85, 112, 156 and 1080 minutes to determine if the compositions had gelled. Gels times are also reported in Table 3.

TABLE 3

| Example | Composition (grams) | | | | | Gel Time (minutes) |
|---|---|---|---|---|---|---|
| | MB-3 | CPQ | KC-1 | DABCO33 | EX-9 | |
| CE-H | 0.7464 | 0 | 0 | 0.0069 | 0 | 65 |
| EX-9 | 1.9996 | 0.0670 | 0.0123 | 0 | 0 | 1080 |
| EX-10 | 0 | 0 | 0 | 0.0103 | 0.9943 | 85 |

Comparative Example I (CE-I)

CGI-90 (0.0872 grams), EX-214L (0.1693 grams), GE-30 (0.2059 grams), and LP-33 (1.5627 grams) were added to a Max 10 opaque white plastic mixing cup. The composition was mixed for two minutes, in one minute intervals, at 21° C. and 3,000 rpm using the centrifugal mixer. The composition was allowed to stand in the sealed mixing cup for 45 minutes at 21° C., then mixed again for two minutes, in one minute intervals at 3,000 rpm.

Example 11 (EX-11)

1.0232 grams Comparative Example I (CE-I), 0.0278 grams CPQ and 0.0058 grams KC-1 were added to a new Max 10 mixing cup and mixed for two minutes, in one minute intervals, at 3,000 rpm. The composition was allowed to stand in the sealed mixing cup for 1 hour at 21° C., then mixed again for two minutes, in one minute intervals at 3,000 rpm. The composition was allowed to stand in the sealed mixing cup for an additional 40 minutes at 21° C., then mixed again for two minutes, in one minute intervals at 3,000 rpm.

Comparative Examples J-K and Examples 12-13 (CE-J and CE-K; EX-12 and EX-13)

A master batch, MB4, was prepared as generally described for preparing MB1, according to the following composition: CGI-90 (0.2542 grams), EPON-862 (0.6000 grams) and AC-1 (5.0200 grams). Comparatives Examples CE-J and CE-K, and Examples of the present invention, EX-12 and EX-13, were prepared as generally described in CE-D and EX-1, according to the compositions listed in Table 4.

TABLE 4

| Example | Composition (grams) | | |
|---|---|---|---|
| | MB-4 | CPQ | KC-1 |
| CE-J | 1.0060 | 0.0335 | 0 |
| CE-K | 0.9954 | 0 | 0.0124 |

TABLE 4-continued

| Example | Composition (grams) | | |
|---|---|---|---|
| | MB-4 | CPQ | KC-1 |
| EX-12 | 1.0164 | 0.0334 | 0.0067 |
| EX-13 | 1.0239 | 0.0165 | 0.0069 |

Comparative Examples L-M (CE-L and CE-M)

Comparative Example L was prepared as follows. CGI-90 (0.3055 grams), EPON-862 (0.7137 grams) and AC-1 (6.0322 grams) were added to a Max 10 opaque white plastic mixing cup. The composition was mixed for two minutes, in one minute intervals, at 21° C. and 3,000 rpm using the centrifugal mixer. The composition was allowed to stand in the sealed mixing cup for 45 minutes at 21° C., then mixed again for two minutes, in one minute intervals at 3,000 rpm. Comparative Example M was prepared by adding 0.0514 grams ITX and 1.0239 grams CE-L to a new Max 10 cup. The composition was mixed for two minutes, in one minute intervals, at 21° C. and 3,000 rpm using the centrifugal mixer. The composition was allowed to stand in the sealed mixing cup for 1 hour at 21° C., then mixed again for two minutes, in one minute intervals at 3,000 rpm. The composition was allowed to stand in the sealed mixing cup for an additional 40 minutes at 21° C., then mixed again for two minutes, in one minute intervals at 3,000 rpm.

Examples 14-15 (EX-14 and EX-15)

Examples 14 and 15 were prepared, as generally described in Examples 9 and 10, respectively, according to the compositions listed in Table 5, where CE-L replaced MB-3 in the preparation. After mixing, the compositions were held in the sealed cups at 21° C., and the cups periodically opened and inspected for gelling after 95, 170, 212, 310, 1380, and 1518 minutes to determine if the compositions had gelled. Gels times are also reported in Table 5.

TABLE 5

| Example | Composition (grams) | | | | | Gel Time (minutes) |
|---|---|---|---|---|---|---|
| | CE-L | CPQ | KC-1 | DABCO33 | EX-14 | |
| EX-14 | 2.0109 | 0.0537 | 0.0130 | 0 | 0 | 1518 |
| EX-15 | 0 | 0 | 0 | 0.0099 | 1.0177 | 95 |

The weight percentages and phr's of the above Comparative Examples and Examples of the present invention are listed in Table 6. For EX-1 through EX-11 and CE-A through CE-I, the weight percentages and phr's use the total weight of LP-33, GE-30, EX-214L and CGI-90 as a basis. For EX-12 and EX-13 and CE-J through CE-L, the weight percentages and phr's use the total weight of AC-1, EPON 862, and CGI-90 as a basis, i.e., parts photosensitizer per hundred parts of the combination of polythiol, polyepoxide, and photolatent amine by weight, or phr=[wt. photosensitizer/(wt. polythiol(s)+wt. polyepoxide(s)+wt. photolatent amine)]×100.

TABLE 6

| Example | Composition (Weight %) | | | | | | Photosensitizer (phr) | | | |
|---|---|---|---|---|---|---|---|---|---|---|
| | LP-33 | GE-30 | EX-214L | CGI-90 | AC-1 | EPON 862 | CPQ | KC-1 | KC-2 | ITX |
| CE-A | 78.0 | 9.5 | 8.2 | 4.3 | 0 | 0 | 0 | 0 | 0 | 5.10 |
| CE-B | 77.5 | 9.5 | 8.7 | 4.3 | 0 | 0 | 1.66 | 0 | 0 | 0 |
| CE-C | 77.7 | 9.6 | 8.3 | 4.4 | 0 | 0 | 0 | 4.60 | 0 | 0 |
| CE-D | 77.6 | 9.8 | 8.3 | 4.3 | 0 | 0 | 3.32 | 0 | 0 | 0 |
| CE-E | 77.6 | 9.8 | 8.3 | 4.3 | 0 | 0 | 0 | 1.26 | 0 | 0 |
| EX-1 | 77.6 | 9.8 | 8.3 | 4.3 | 0 | 0 | 3.31 | 1.26 | 0 | 0 |
| EX-2 | 77.6 | 9.8 | 8.3 | 4.3 | 0 | 0 | 3.27 | 0.56 | 0 | 0 |
| EX-3 | 77.6 | 9.8 | 8.3 | 4.3 | 0 | 0 | 1.65 | 1.26 | 0 | 0 |
| EX-4 | 77.6 | 9.8 | 8.3 | 4.3 | 0 | 0 | 1.67 | 0.57 | 0 | 0 |
| CE-F | 77.5 | 9.8 | 8.4 | 4.4 | 0 | 0 | 3.37 | 0 | 0 | 0 |
| CE-G | 77.5 | 9.8 | 8.4 | 4.4 | 0 | 0 | 0 | 0 | 1.25 | 0 |
| EX-5 | 77.5 | 9.8 | 8.4 | 4.4 | 0 | 0 | 3.34 | 0 | 1.24 | 0 |
| EX-6 | 77.5 | 9.8 | 8.4 | 4.4 | 0 | 0 | 3.29 | 0 | 0.57 | 0 |
| EX-7 | 77.5 | 9.8 | 8.4 | 4.4 | 0 | 0 | 1.65 | 0 | 1.21 | 0 |
| EX-8 | 77.5 | 9.8 | 8.4 | 4.4 | 0 | 0 | 1.68 | 0 | 0.59 | 0 |
| EX-9 | 76.8 | 9.7 | 9.1 | 4.3 | 0 | 0 | 3.35 | 0.62 | 0 | 0 |
| CE-I | 77.2 | 10.2 | 8.4 | 4.3 | 0 | 0 | 0 | 0 | 0 | 0 |
| EX-11 | 77.2 | 10.2 | 8.4 | 4.3 | 0 | 0 | 2.72 | 0.57 | 0 | 0 |
| CE-J | 0 | 0 | 0 | 4.3 | 85.5 | 10.2 | 3.33 | 0 | 0 | 0 |
| CE-K | 0 | 0 | 0 | 4.3 | 85.5 | 10.2 | 0 | 1.25 | 0 | 0 |
| EX-12 | 0 | 0 | 0 | 4.3 | 85.5 | 10.2 | 3.29 | 0.66 | 0 | 0 |
| EX-13 | 0 | 0 | 0 | 4.3 | 85.5 | 10.2 | 1.61 | 0.67 | 0 | 0 |
| CE-L | 0 | 0 | 0 | 4.3 | 85.5 | 10.1 | 0 | 0 | 0 | 0 |
| CE-M | 0 | 0 | 0 | 4.3 | 85.5 | 10.1 | 0 | 0 | 0 | 5.02 |
| EX-14 | 0 | 0 | 0 | 4.3 | 85.5 | 10.1 | 2.67 | 0.65 | 0 | 0 |

Light Curing

After the final mixing step, the composition was applied dropwise to the surface of a polyethylene terephthalate film having a fluorosilicone release coating, obtained under the trade designation "MD11" from Siliconature USA, LLC, Chicago, Ill. The drop was deposited with a 2 mL disposable plastic transfer pipet (Samco Scientific Corporation, San Fernando, Calif.). In the case of the compositions that contained the polysulfide LP-33, the drops on the release liner, i.e., the sessile drops, weighed approximately 0.03 to 0.04 grams and had a diameter of approximately 6 mm and a height from base to peak of approximately 1.7 mm. In the case of the compositions that contained the polythioether AC-1, the drops on the release liner, i.e., the sessile drops, weighed approximately 0.04 to 0.05 grams and had a diameter of approximately 6 mm and a height from base to peak of approximately 2.0 mm. The difference in the size of the drops was a consequence of the higher viscosity for the compositions that contained the polythioether. The sessile drop was irradiated with blue light in 6 successive 20 second long intervals for a cumulative irradiation time of 120 seconds. Immediately following a 20 second long interval of irradiation, the consistency of the drop was quickly checked by touching or probing with a small wooden applicator stick or dowel that was approximately 2 mm in diameter, and then the next interval begun. The cumulative time of irradiation required for the first appearance of any gel was recorded, and is referred to as "Time A" in Table 7. Gel usually initially appeared at the top surface or top portion of the drop depending on the amount of gel that had formed. This cumulative time provided an indication of the initial cure rate of the composition. The shorter the time, the faster the cure rate. The cumulative time of irradiation required for the bulk of the drop to gel was also recorded, and is referred to as "Time B" in Table 7. Both the cure rate and the ability of light to penetrate or propagate through the composition as it cures factor into this time. A LED light, "PARADIGM DEEPCURE LED CURING LIGHT" from 3M Company, St. Paul, Minn. was used as the blue light source. This LED light provided 430 to 480 nm wavelength light at an intensity of 1470 mW/cm$^2$ directly next to the tip of the light source (end of the light guide) with peak intensity at 444 to 452 nm. The tip of the light source was held directly above the sessile drop at approximately 7 mm away from the top or peak of the sessile drop. The light intensity at a distance of 7 mm from the tip of the light source and at the peak of the sessile drop was approximately 1000 mW/cm$^2$. The cumulative irradiation times for the first appearance of gel (Time A) and gelation of the bulk of the drop (Time B) are listed in Table 7 for the compositions. "NO" indicates that gelation, either the first appearance or the bulk of the drop, did not occur after 6 successive 20 second long intervals of irradiation to afford a cumulative time of 120 seconds.

TABLE 7

| Example | Cumulative Irradiation Time (seconds) | |
|---|---|---|
| | Time A | Time B |
| CE-A | NO | NO |
| CE-B | 80 | 100 |
| CE-C | 80 | NO |
| CE-D | 40 | 100 |
| CE-E | 100 | NO |
| EX-1 | 20 | 40 |
| EX-2 | 20 | 40 |
| EX-3 | 20 | 40 |
| EX-4 | 20 | 40 |
| CE-F | 40 | 100 |
| CE-G | 120 | NO |
| EX-5 | 20 | 100 |
| EX-6 | 20 | 40 |
| EX-7 | 20 | 40 |
| EX-8 | 20 | 40 |
| EX-9 | 20 | 40 |
| EX-10 | 20 | 40 |
| CE-I | NO | NO |
| EX-11 | 20 | 40 |
| CE-J | 40 | 100 |
| CE-K | NO | NO |
| EX-12 | 20 | 60 |
| EX-13 | 20 | 40 |
| CE-L | NO | NO |
| CE-M | 100 | NO |

TABLE 7-continued

| Example | Cumulative Irradiation Time (seconds) | |
|---|---|---|
| | Time A | Time B |
| EX-14 | 20 | 40 |
| EX-15 | 20 | 40 |
| CE-N | 40 | 100 |

Comparative Example N (CE-N)

CGI-90 (0.1716 grams), EX-214L (0.3305 grams), GE-30 (0.3802 grams), and LP-33 (3.0518 grams) were added to a Max 10 opaque white plastic mixing cup. The composition was mixed for two minutes, in one minute intervals, at 21° C. and 3000 rpm using the centrifugal mixer. The composition was allowed to stand in the sealed mixing cup for 45 minutes at 21° C., then mixed again for two minutes, in one minute intervals at 3000 rpm. 1.0012 grams of this composition (which included 77.6 weight % LP-33, 9.7 weight % GE-30, 8.4 weight % EX-214L, and 4.4 weight % CGI-90) and 0.0332 grams CPQ and 0.0127 grams Coumarin 314 were added to a new Max 10 mixing cup and mixed for two minutes, in one minute intervals, at 3000 rpm using the centrifugal mixer. The composition was allowed to stand in the sealed mixing cup for 1 hour at 21° C., then mixed again for two minutes, in one minute intervals at 3000 rpm. The composition was allowed to stand in the sealed mixing cup for an additional 40 minutes at 21° C., then mixed again for two minutes, in one minute intervals at 3000 rpm.

CE-N was subjected to light curing using the method described above. The results are provided in Table 7, above.

Various modifications and alterations of this disclosure may be made by those skilled the art without departing from the scope and spirit of the disclosure, and it should be understood that this invention is not to be unduly limited to the illustrative embodiments set forth herein.

What is claimed is:

1. A composition comprising a photolatent amine, camphorquinone, and a coumarin sensitizer, wherein the coumarin sensitizer comprises at least one of 3,3'-carbonylbis (5,7-dimethoxycoumarin), 3-benzoyl-7-diethylaminocoumarin, 7-diethylamino-3-thenoylcoumarin, 3-(2-benzofuroyl)-7-diethylaminocoumarin, 7-diethyl-amino-5',7'-dimethoxy-3,3'-carbonylbiscoumarin, 3,3'-carbonylbis(7-diethylaminocoumarin), 9-(7-diethylamino-3-coumarinoyl)-1,2,4,5-tetrahydro-3H,6H,10H[1]benzopyrano[9,9a,1-gh]quinolazine-10-one, and 9,9'-carbonylbis(1,2,4,5-tetrahydro-3H,6H,10H[1]benzopyrano[9,9a,1-gh]quinolazine-10-one).

2. The composition of claim 1, wherein the coumarin sensitizer comprises at least one of 3,3'-carbonylbis(7-diethylaminocoumarin), 7-diethylamino-3-thenoylcoumarin, 3-(2-benzofuroyl)-7-diethylaminocoumarin, and 9,9'-carbonylbis(1,2,4,5-tetrahydro-3H,6H,10H[1]benzopyrano[9,9a,1-gh]quinolazine-10-one).

3. A composition comprising a photolatent amine, camphorquinone, and a coumarin sensitizer, wherein the coumarin sensitizer is a triplet photosensitizer and has an absorbance with a wavelength of maximum absorbance in a range from 390 nanometers to 510 nanometers, and wherein the photolatent amine is represented by formula:

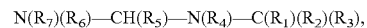

wherein
R$_1$ is selected from the group consisting of phenyl, naphthyl, phenanthryl, anthracenyl, pyrenyl, 5,6,7,8-tetrahydro-2-naphthyl, 5,6,7,8-tetrahydro-1-naphthyl, thienyl, benzo[b]thienyl, naphtho[2,3-b]thienyl, thianthrenyl, anthraquinonyl, dibenzofuryl, chromenyl, xanthenyl, thioxanthyl, phenoxathiinyl, pyrrolyl, imidazolyl, pyrazolyl, pyrazinyl, pyrimidinyl, pyridazinyl, indolizinyl, isoindolyl, indolyl, indazolyl, purinyl, quinolizinyl, isoquinolyl, quinolyl, phthalazinyl, naphthyridinyl, quinoxalinyl, quinazolinyl, cinnolinyl, pteridinyl, carbazolyl, β-carbolinyl, phenanthridinyl, acridinyl, perimidinyl, phenanthrolinyl, phenazinyl, isothiazolyl, phenothiazinyl, isoxazolyl, furazanyl, terphenyl, stilbenyl, fluorenyl, phenoxazinyl, and combinations thereof, wherein any of these are unsubstituted or substituted by one or more alkyl, alkenyl, alkynyl, haloalkyl, —NO$_2$, —NR$_{10}$R$_{11}$, —CN, —OR$_{12}$, —SR$_{12}$, —C(O)R$_{13}$, —C(O)OR$_{14}$, or halogen groups, a radical of the formula N(R$_7$)(R$_6$)—CH(R$_5$)—N(R$_4$)—C(R$_1$)(R$_2$)(R$_3$)—, or a combination thereof;

R$_2$ and R$_3$ each are independently selected from the group consisting of hydrogen, alkyl, and phenyl that is unsubstituted or is substituted by one or more times by alkyl, CN, —OR$_{12}$, —SR$_{12}$, halogen, or haloalkyl;

R$_5$ is alkyl or —NR$_8$R$_9$;

R$_4$, R$_6$, R$_7$, R$_8$, R$_9$, R$_{10}$, R$_{11}$, R$_{12}$, R$_{13}$, and R$_{14}$ are each independently hydrogen or alkyl; or R$_4$ and R$_6$ together form a C$_2$-C$_6$ alkylene bridge that is unsubstituted or substituted by one or more alkyl groups having up to four carbon atoms; or R$_5$ and R$_7$, independently of R$_4$ and R$_6$, together form a C$_2$-C$_6$ alkylene bridge that is unsubstituted or is substituted by one or more alkyl groups having up to four carbon atoms; or if R$_5$ is —NR$_8$R$_9$, R$_7$ and R$_9$ together form a C$_2$-C$_6$ alkylene bridge that is unsubstituted or substituted by one or more alkyl groups having up to four carbon atoms.

4. The composition of claim 3, wherein the photolatent amine comprises at least one compound represented by formula

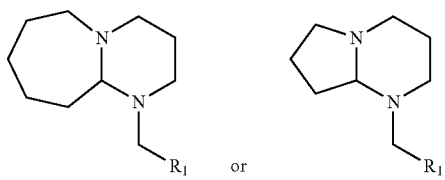

wherein R$_1$ is phenyl, naphthyl, or anthracenyl, each of which is unsubstituted or substituted by at least one substituent selected from the group consisting of methyl, cyano, nitro, ethenyl, and chloro.

5. The composition of claim 3, wherein photolatent amine photochemically generates at least one of 1,8-diazabicyclo[5.4.0]undec-7-ene (DBU) or 1,5-diazabicyclo[4.3.0]non-5-ene (DBN).

6. The composition of claim 3, further comprising at least one polymerizable material.

7. The composition of claim 3, further comprising a polythiol comprising more than one thiol group and a polyepoxide comprising more than one epoxide group.

8. The composition of claim 7, wherein the polythiol is monomeric.

9. The composition of claim 7, wherein the polythiol is an oligomeric or polymeric polythioether or polysulfide.

10. The composition of claim 7, further comprising a second amine, wherein the second amine comprises at least one of triethylamine, dimethylethanolamine, benzyldimethylamine, dimethylaniline, tribenzylamine, triphenylamine, tetramethylguanidine (TMG), 1,8-diazabicyclo[5.4.0]undec-7-ene (DBU), 1,5-diazabicyclo[4.3.0]non-5-ene (DBN), 1,4-diazabicyclo[2.2.2]octane (DABCO), quinuclidine, diphenylguanidine (DPG), dimethylaminomethyl phenol, or tris(dimethylaminomethyl)phenol.

11. A polymer network preparable from the composition of claim 7, wherein at least some of the thiol groups and epoxide groups have reacted to form thioether groups and hydroxyl groups.

12. The polymer network of claim 11, wherein the polymer network is a sealant disposed on an aircraft.

13. A method of making a polymer network, the method comprising:
combining the composition of claim 3 with a curable material; and
exposing the curable material to light having a wavelength in a range from 400 nanometers to 510 nanometers to at least partially cure the curable material.

14. The method of claim 13, wherein the curable material comprises a polythiol comprising more than one thiol group and a polyepoxide comprising more than one epoxide group.

15. The composition of claim 1, wherein a weight ratio of the photolatent amine to a combined weight of camphorquinone and the coumarin sensitizer is in a range from 1:1 to 5:1.

16. The composition of claim 1, wherein a weight ratio of camphorquinone to the coumarin sensitizer is in range from 1:1 to 10:1.

17. The composition of claim 1, further comprising at least one polymerizable material.

18. The composition of claim 1, further comprising a polythiol comprising more than one thiol group and a polyepoxide comprising more than one epoxide group.

19. The composition of claim 18, wherein the polythiol is an oligomeric or polymeric polythioether or polysulfide.

20. The composition of claim 3, wherein the coumarin sensitizer comprises at least one of 3,3'-carbonylbis(5,7-dimethoxycoumarin), 3-benzoyl-7-diethylaminocoumarin, 7-diethylamino-3-thenoylcoumarin, 3-(2-benzofuroyl)-7-diethylaminocoumarin, 7-diethylamino-5',7'-dimethoxy-3,3-carbonylbiscoumarin, 3,3'-carbonylbis(7-diethylaminocoumarin), 9-(7-diethylamino-3-coumarinoyl)-1,2,4,5-tetrahydro-3H, 6H,10H[1]benzopyrano [9,9a, 1-gh] quinolazine-10-one, and 9,9'-carbonylbis(1,2,4,5-tetrahydro-3H,6H,10H[1]benzopyrano[9,9a,1-gh] quinolazine-10-one).

* * * * *